(12) United States Patent
Sio et al.

(10) Patent No.: US 12,261,115 B2
(45) Date of Patent: Mar. 25, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Kam-Tou Sio, Zhubei (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 430 days.

(21) Appl. No.: 17/314,897

(22) Filed: May 7, 2021

(65) Prior Publication Data
US 2022/0238442 A1    Jul. 28, 2022

Related U.S. Application Data

(60) Provisional application No. 63/142,034, filed on Jan. 27, 2021.

(51) Int. Cl.
*H01L 23/528* (2006.01)
*G06F 30/392* (2020.01)
(Continued)

(52) U.S. Cl.
CPC ........ *H01L 23/5286* (2013.01); *G06F 30/392* (2020.01); *H01L 21/768* (2013.01); *H01L 27/0886* (2013.01)

(58) Field of Classification Search
CPC ..... H01L 21/823821; H01L 21/823475; H01L 23/5386; H01L 23/5283; H01L 27/0886; H01L 27/0924
See application file for complete search history.

(56) References Cited

U.S. PATENT DOCUMENTS 9,704,862 B2 * 7/2017 Park ..................... H01L 27/092
2014/0284723 A1 * 9/2014 Lee ..................... H01L 29/0649
257/369
(Continued)

FOREIGN PATENT DOCUMENTS

| CN | 109952642 A * | 6/2019 | ......... G06F 17/5072 |
| DE | 10 2016 117 786 A1 | 3/2018 | |

(Continued)

OTHER PUBLICATIONS

Korean Notice of Allowance issued in connection with KR App. Ser. No. 10-2021-0088497 dated Aug. 22, 2022 (4 pages).
(Continued)

Primary Examiner — Tuan A Hoang
(74) Attorney, Agent, or Firm — FOLEY & LARDNER LLP

(57) ABSTRACT

A semiconductor device includes a first active region, disposed on a first side of a substrate, that extends along a first lateral direction. The semiconductor device includes a second active region, disposed on the first side, that extends along the first lateral direction. The first active region has a first conduction type and the second active region has a second conduction type opposite to the first conduction type. The semiconductor device includes a first interconnect structure, formed on a second side of the substrate opposite to the first side, that includes: a first portion extending along the first lateral direction and vertically disposed below the first active region; and a second portion extending along a second lateral direction. The first latera direction is perpendicular to the first lateral direction.

16 Claims, 24 Drawing Sheets

(51) Int. Cl.
    *H01L 21/768*     (2006.01)
    *H01L 27/088*     (2006.01)

(56)     References Cited

U.S. PATENT DOCUMENTS

| | | |
|---|---|---|
| 2016/0093603 A1 | 3/2016 | Hsieh et al. |
| 2019/0155984 A1* | 5/2019 | Chen .................. H01L 27/0207 |
| 2019/0378790 A1 | 12/2019 | Bohr et al. |
| 2020/0035560 A1* | 1/2020 | Block ............. H01L 21/823871 |
| 2020/0050728 A1* | 2/2020 | Kim ...................... G06F 30/392 |
| 2020/0075770 A1* | 3/2020 | Kobrinsky ...... H01L 21/823475 |
| 2020/0134128 A1 | 4/2020 | Peng et al. |
| 2020/0303551 A1 | 9/2020 | Chen et al. |
| 2020/0373331 A1 | 11/2020 | Kim et al. |

FOREIGN PATENT DOCUMENTS

| | | |
|---|---|---|
| DE | 10 2020 121 641 B3 | 9/2021 |
| JP | 2004186561 A * | 7/2004 |
| KR | 20190054889 A | 5/2019 |
| KR | 20190058369 A | 5/2019 |
| KR | 20190132089 A | 11/2019 |
| KR | 20200037109 A | 4/2020 |
| KR | 20200121739 A | 10/2020 |

OTHER PUBLICATIONS

Office Action and Search Report for TW 110124465 dated Nov. 8, 2021 (5 pages).

* cited by examiner

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/142,034, filed Jan. 27, 2021, entitled "SYSTEMS AND METHODS FOR LAYOUT DESIGNS HAVING A BACK SIDE SIGNAL LINE," which is incorporated herein by reference in its entirety for all purposes.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
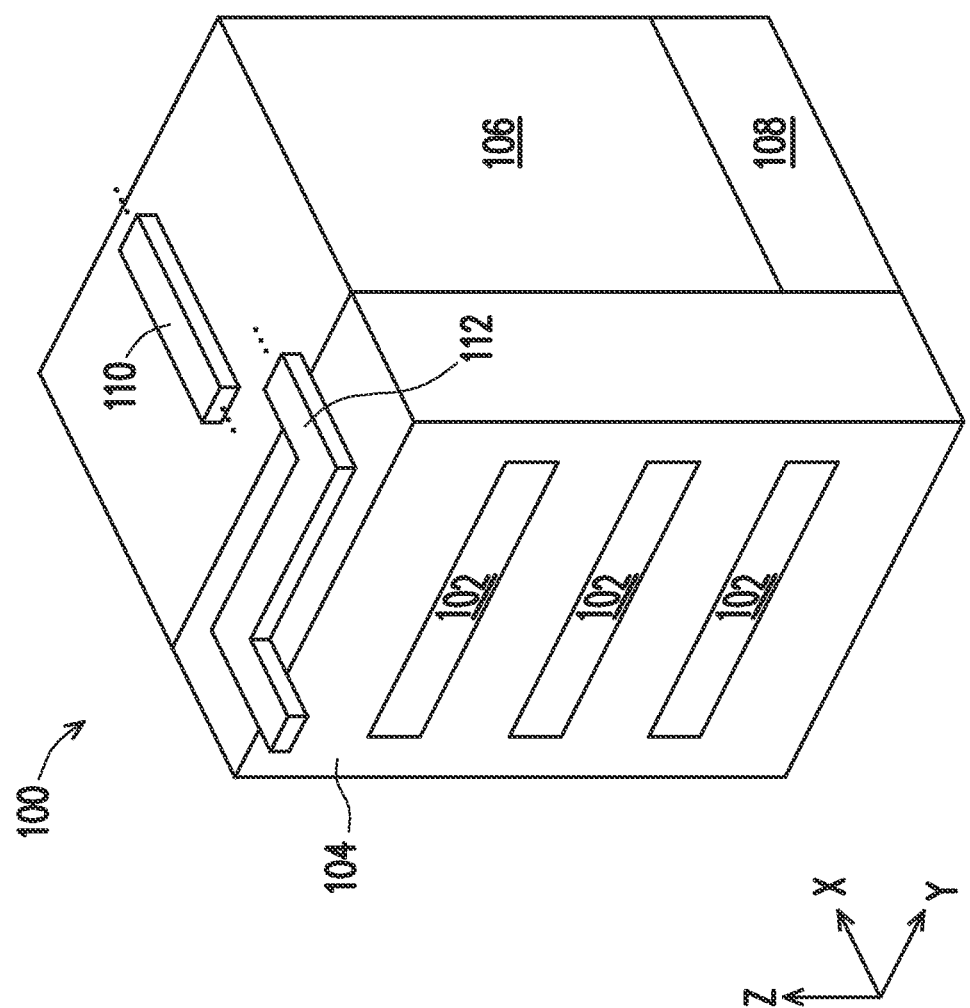
FIG. 1 illustrates a perspective view of a non-planar transistor device that includes back side power lines and signal lines, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor IC design, standard cells methodologies are commonly used for the design of semiconductor devices on a chip (or wafer). Standard cell methodologies use standard cells as abstract representations of certain functions to integrate millions, or billions, devices on a single chip. As ICs continue to scale down, more and more devices are integrated into the single chip. This scaling down process generally provides benefits by increasing production efficiency and lowering associated costs.

In contemporary semiconductor device fabrication processes, each cell can include a certain number of semiconductor devices, such as field effect transistors ("FETs"). Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that can wrap around the full perimeter of one or more nanosheets for improved control of channel current flow. For example, in a FinFET and a nanosheet transistor with similar dimensions, the nanosheet transistor can present larger driving current (Ion), smaller subthreshold leakage current ($I_{off}$), etc. Such a transistor that has a gate structure wrapping around its channel is typically referred to as a gate-all-around (GAA) transistor or GAA FET.

Given such a gate structure that wraps around the channel, at least some of the interconnect structures, which are typically formed on a front side of the chip in the FinFET configuration, can be formed on a back side of the chip, which can further reduce the area (e.g., the cell height) of a corresponding cell. In the existing technologies, those interconnect structures, however, typically extend along a one-dimensional direction and exclusively function as power rails (sometimes referred to as power grids or power lines). This may potentially limit flexibility and scalability of the layout design of an integrated circuit adopting the GAA transistor architecture.

The present disclosure provides various embodiments of a semiconductor device (or an integrated circuit) that can be represented by (or formed based on) a number of standard cells. Each of the cell, as disclosed herein, includes a number of GAA transistors, while it should be appreciated that any of various other transistor architectures that allow interconnect structures to be formed on the back side can be included in each of the cells. For example, the cell can include a number of transistors formed in a complementary field-effect transistor (CFET) configuration where two active regions in respective different conduction types (e.g., n-type and p-type) are disposed at two vertically aligned levels.

In accordance with various embodiments, some of the cells may have one or more back side interconnect structures that are allowed to extend in more than one direction. Such back side interconnect structures can be configured to carry signals rather than only power supply voltages (e.g., VDD, VSS). As disclosed herein, a back side interconnect structure, configured to carry a signal other than a power supply voltage and allowed to extend in more than one direction, can sometimes be referred to as a "multi-dimensional (MD) signal line." For example, some of the cells having a relatively short cell height can include one or more of these MD signal lines. Other back side interconnect structures can still be configured to carry power supply voltages. Such back side interconnect structures, configured to carry the power supply voltages, may be allowed to extend in one direction. As disclosed herein, a back side interconnect structure, configured to carry a power supply voltage and not allowed to extend in more than one direction, can sometimes be referred to as a "single-dimensional (SD) power line." For example, some of the cells having a relatively tall cell height can include one or more of these SD power lines. With the disclosed MD signal lines, flexibility of designing an integrated circuit can be significantly increased, and thus, scalability of the integrated circuit can be further extended.

FIG. 1 illustrates a perspective view of an example GAA FET device 100 that includes one or more multi-dimensional (MD) signal lines and one or more single-dimensional (SD) power lines, in accordance with various embodiments. It should be noted that the GAA FET device 100 shown in FIG. 1 is upside down, such that the MD signal line and SD power line are disposed on top of a formed GAA transistor. For example, the GAA FET device 100 includes a number of semiconductor layers (e.g., nanosheets, nanowires, or otherwise nanostructures) 102 vertically separated from one another, which can collectively function as a (conduction) channel of the GAA FET device 100. The channel may extend along a first direction (e.g., the X axis). The GAA FET device 100 includes a (e.g., metal) gate structure 104 wrapping around each of the semiconductor layers 102 (e.g., wrapping a perimeter of each of the semiconductor layers 102). The gate structure 104 may extend a second direction perpendicular to the first direction (e.g., the Y axis). The GAA FET device 100 includes source/drain structures disposed on opposing sides of the gate structure 104 (along the extending direction of the channel), e.g., one of such source/drain structures, 106, as shown in FIG. 1. The GAA FET device 100 includes an interlayer dielectric (ILD) 108 over the source/drain structure 106, when FIG. 1 is viewed upside down.

Over the back side of the GAA FET device 100 (e.g., the upper side of FIG. 1), a SD power line 110 and a MD signal line 112 are shown. The SD power line 110 may extend along the X axis. The MD signal line 112 may include a number of portions, one or more of which may extend along the X axis, and one or more of which may extend along the Y axis. As will be discussed (and shown) below, the SD power line 110, configured to carry a power supply voltage (e.g., VDD, VSS), can electrically couple to one or more source/drain structures through one or more back side via structures. Such a power supply voltage is sometimes referred to as a power signal. The MD signal line 112, configured to carry a signal other than the power supply voltage, can electrically couple to one or more source/drain structures through one or more back side via structures. Such a signal other than the power supply voltage is sometimes referred to as a non-power signal.

The GAA FET device shown in FIG. 1 is simplified, and thus, it should be understood that one or more features of a completed GAA FET device may not be shown in FIG. 1. For example, the other source/drain structure opposite the gate structure 104 from the source/drain structure 106 and the ILD disposed over such a source/drain structure, a gate spacer between the gate structure 104 and the source/drain structure 106, an inner spacer between the source/drain structure 106 and each semiconductor layer 102, and the back side via structures connecting the MD signal lines/SD power lines are not shown in FIG. 1. Further, it should be understood that the spatial configurations among the SD power line 110, MD signal line 112, and other structures of the GAA FET device 100 shown in FIG. 1 are provided for illustration purposes and should not be limited thereto.

Figure 2:
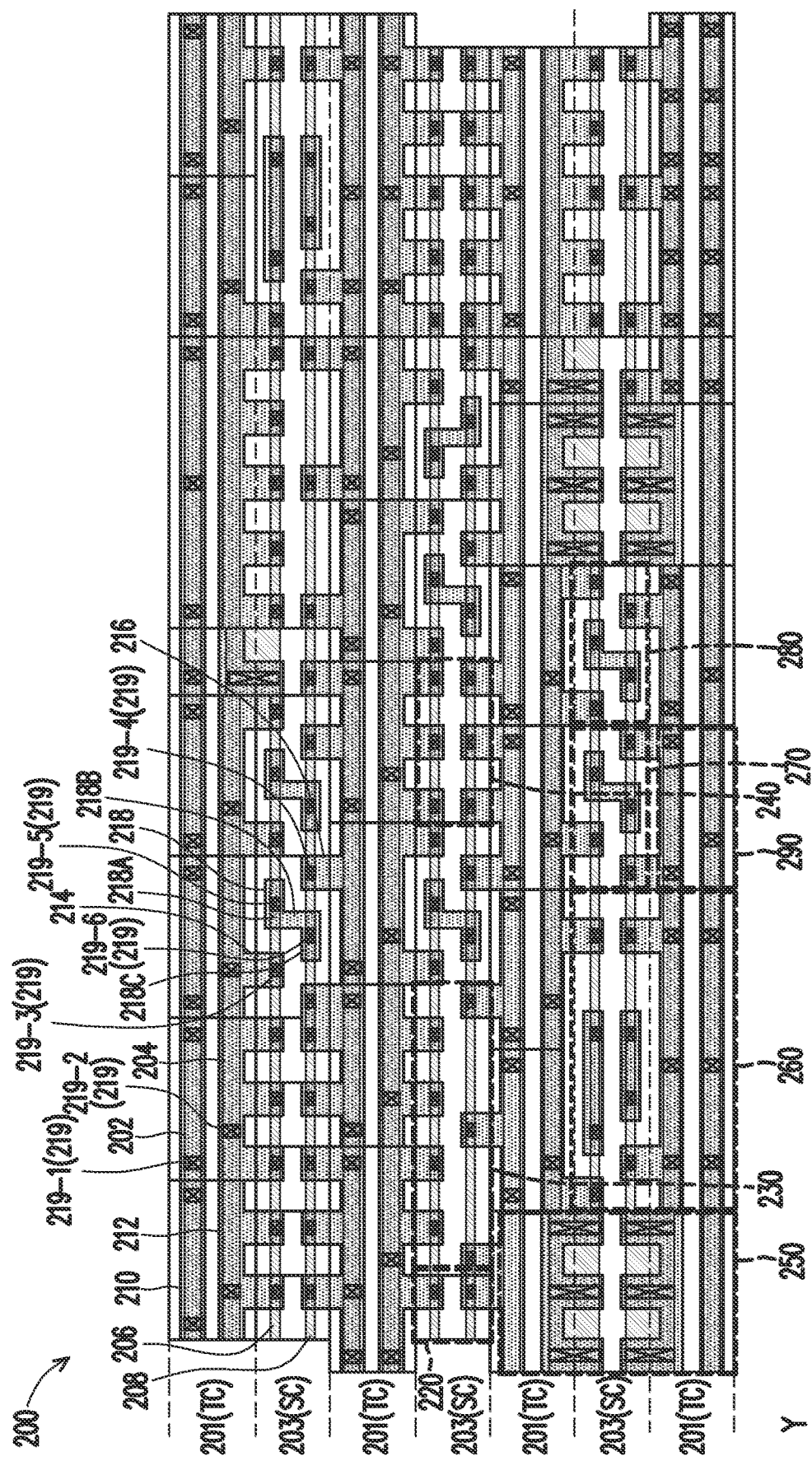
FIG. 2 illustrates a layout design of a semiconductor device that includes back side power lines and signal lines, in accordance with some embodiments.

FIG. 2 illustrates an example layout design 200, in accordance with various embodiments of the present disclosure. The layout design 200 may be used to fabricate at least a portion of a semiconductor device (e.g., an integrated circuit having a number of circuits operatively coupled to one another). Not all of the illustrated components are required, however, and some embodiments of the present disclosure may include additional components not shown in FIG. 2. Variations in the arrangement and type of the components may be made without departing from the scope of the present disclosure as set forth herein. Additional, different or fewer components may be included.

The semiconductor device corresponding to the layout design 200 may be fabricated based on forming a number of transistor features/structures (e.g., channel structures, source structures, drain structures) along one or more active regions over the front side of a substrate. Although the layout design 200 in FIG. 2 includes a number of patterns to respectively form a number of features/structures on the back side of a substrate, it should be thus understood that the layout design 200 can also include a number of patterns to respectively form a number of features/structures on the front side of the substrate, which will be discussed below. It is noted that the layout design 200 is viewed from its back, and thus, in FIG. 2, the patterns to form the back side features/structures are on top of the patterns to form the front side features/structures.

The layout design 200 includes a number of cell rows 201 and 203 arranged (e.g., laid out) with respect to a space, grid, or floorplan for the design of an integrated circuit. Such a floorplan can correspond to a substrate where the semiconductor device is fabricated, in some embodiments. The cell rows of the layout design 200 may have at least two respective different row heights, cell heights, or heights. As shown, the cell rows 201 may have a first row height, and the cell rows 203 may have a second row height, in which the first row height is greater than the second row height. As a non-limiting example, the first row height can be between about 10 nanometers (nm) and about 85 nm, and the second row height can be between about 10 nm and about 40 nm. Hereinafter, the cell rows 201 and the cell rows 203 may sometimes be referred to as tall cell (TC) rows and short cell (SC) rows, respectively. The row height can correspond to the cell height of a cell (sometimes referred to as a standard cell) to be placed therein. In the illustrated example of FIG. 2, the cell rows 201 and 203 are alternately arranged with one another, but it should be appreciated that the cell rows with different row heights can be arranged in any of various other configurations (e.g., 2 SC row abutted to 1 TC rows), while remaining within the scope of present disclosure.

Each of the TC/SC rows includes a number of active region patterns extending along the X axis. As a non-limiting example, the TC row 201 includes active region patterns 202 and 204, and the SC row 203 includes active region patterns 206 and 208. The active region patterns 202, 204, 206, and 208 are each configured to form an active region over the substrate, hereinafter "active region 202," "active region 204," "active region 206," and "active region 208," respectively. The active regions 202 to 208 are formed over the front side of the substrate, in some embodiments.

The active regions in each cell row may be characterized with opposite conduction types. For example, in the TC row 201, the active region 202 may be characterized with a first conduction type (e.g., n-type), and the active region 204 may be characterized with a second conduction type (e.g., p-type); and in the SC row 203, the active region 206 may be characterized with a first conduction type (e.g., p-type), and the active region 208 may be characterized with a second conduction type (e.g., n-type).

In a non-limiting example where the layout design 200 is used to form GAA FETs, the active region 202 may include one or more nanosheets stacked on top of one another over the substrate to form a number of n-type transistors; the active region 204 may include one or more nanosheets stacked on top of one another over the substrate to form a number of p-type transistors; the active region 206 may include one or more nanosheets stacked on top of one another over the substrate to form a number of p-type transistors; and the active region 208 may include one or more nanosheets stacked on top of one another over the substrate to form a number of n-type transistors.

In an embodiment, the cell height may correspond to a width along the Y axis of an active region included therein. For example, the SC row and TC row may respectively have a number of active regions, in which the active regions of the TC row have a wider width than the active regions of the SC row. In another embodiment, the cell height may correspond to the number of bottommost interconnect structures, e.g., M0 tracks (as will be discussed below), disposed therein. For example, the SC row and TC row may respectively have a number of M0 tracks, in which the number of M0 tracks of the TC row is greater than the number of M0 tracks of the SC row. In yet another embodiment, the cell height may correspond to the number of active regions included therein. For example, the SC row may have the less number of active regions, while the TC row may have the more number of active regions.

According to various embodiments of the present disclosure, each of the TC rows can include a number of first patterns extending along the X axis to form first interconnect structures on the back side; each of the SC rows can include a number of second patterns to form second interconnect structures on the back side, each of which is formed as a pad abutting one of the first interconnect structure patterns in the TC row; and each of the SC rows can further include a number of third patterns to form third interconnect structures on the back side. Some of the third interconnect structure patterns can have multiple portions, some of which extends along the X axis and some of which extends along the Y axis.

As an illustrative example in FIG. 2, the TC row 201 includes interconnect structure patterns 210 and 212 extending along the X axis. In some embodiments, the interconnect structure patterns 210 and 212 can almost fully extend across the floorplan of the layout design 200. As such, the interconnect structure patterns 210 and 212 may fully overlap with the active regions (patterns) 202 and 204, respectively. The SC row 203 includes interconnect structure patterns 214 and 216 formed as a pad or segment, and an interconnect structure pattern 218 having some portions extending along the X axis and a portion extending along the Y axis. In some embodiments, the interconnect structure patterns 214 and 216 may not fully extend across the floorplan of the layout design. Specifically, the interconnect structure patterns 214 and 216 may abut one of the fully extending interconnect structure patterns 210 and 212 in an adjacent TC row. In some embodiments, the interconnect structure pattern 218 may not fully extend across the floorplan of the layout design. As such, the interconnect structure patterns 214 and 216 may partially overlap with the active regions (patterns) 206 and 208, respectively, and the interconnect structure pattern 218 may partially overlap with both of the active regions (patterns) 206 and 208. Specifically, the interconnect structure pattern 218 may include three portions, 218A, 218B, and 218C, which can be better seen in FIG. 3A.

Figure 3A:
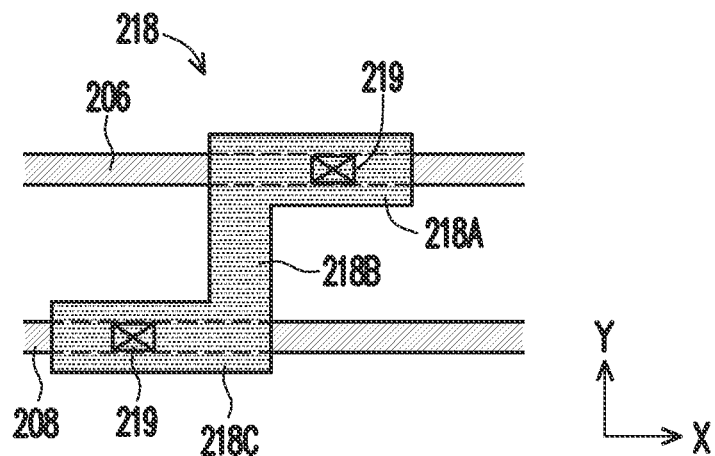
FIGS. 3A, 3B, and 3C illustrate various embodiments of the layout of a back side signal line, in accordance with some embodiments.

In FIG. 3A, the portion 218A extends along the X axis with a certain distance (e.g., less than the width of the floorplan along the X axis). The portion 218C extends along the X axis with a certain distance (e.g., less than the width of the floorplan along the X axis), and is laterally shifted from the portion 218A along the X axis. In some embodiments, the portions 218A and 218C can overlap with the active regions 206 and 208, respectively. The portion 218B, having two ends respectively connected to the portions 218A and 218C, extends along the Y axis. As such, each of the portions 218A and 218C, together with the portion 218B, may form an L-shaped profile. By extending along a different direction than the extending direction of the active regions 206 and 208, the portion 218B can couple the active regions 206 and 208 to each other through a number of via structures 219 (which will be discussed below).

Figure 3B:
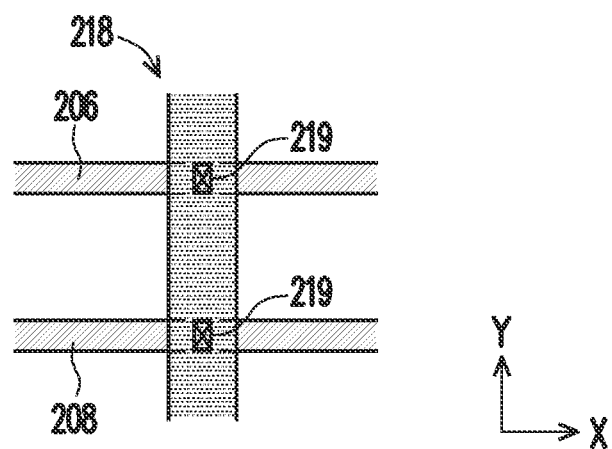
Figure 3C:
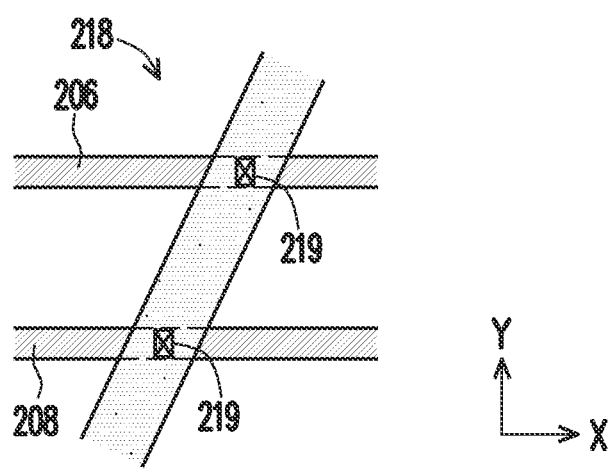

FIGS. 3B and 3C depict other embodiments of the interconnect structure pattern 218, respectively. In FIG. 3B, the interconnect structure pattern 218 extends along the Y axis to overlap with a portion of the active region 206 and a portion of the active region 208, thereby causing the active regions 206 and 208 to be coupled to each other through a number of via structures 219 (which will be discussed below). In FIG. 3C, the interconnect structure pattern 218 extends along a direction between the X axis and Y axis to overlap with a portion of the active region 206 and a portion of the active region 208, thereby causing the active regions 206 and 208 to be coupled to each other through a number of via structures 219 (which will be discussed below). In such an embodiment, the interconnect structure pattern 218 may be tilted with respect to an edge of either of the active region 206 or 208.

Referring again to FIG. 2, the interconnect structure patterns 210 and 212 are each configured to form a first type of the disclosed SD power line over the back side of the substrate (hereinafter "SD power line 210" and "SD power line 212," respectively); the interconnect structure patterns 214 and 216 are each configured to form a second type of the disclosed SD power line over the back side of the substrate (hereinafter "SD power line 214" and "SD power line 216," respectively); and the interconnect structure pattern 218 is configured to form a type of the disclosed MD signal line over the back side of the substrate (hereinafter "MD signal line 218").

Each of the SD power lines and MD signal lines can be (e.g., electrically) couple to an active region through a via structure, as mentioned above. As shown in FIG. 2, the layout design 200 can include a number of patterns 219 configured to form such via structures (hereinafter "via structure 219"). In some embodiments, the via structure 219 is formed on the back side of the substrate to electrically couple each of the SD power lines and MD signal lines to one or more portions of a corresponding active region.

For example, the SD power line 210 can electrically couple to the active region 202 through a number of via structures 219, e.g., 219-1; the SD power line 212 can electrically couple to the active region 204 through a number of via structures 219, e.g., 219-2; the SD power line 214 can electrically couple to the active region 206 through a number of via structures 219, e.g., 219-3; the SD power line 216 can electrically couple to the active region 208 through a number of via structures 219, e.g., 219-4; and the MD signal line 218 can electrically couple to the active regions 206 and 208 through a number of via structures, respectively, e.g., via structures 219-5 and 219-6.

The layout design 200 can include a number of cells arranged over one or more of the cell rows. For example in FIG. 2, the layout design 200 includes cells 220, 230, 240, 250, 260, 270, 280, and 290. The cell 220 is arranged over a single cell row (e.g., one SC row 203); the cell 230 is arranged over a single cell row (e.g., one SC row 203); the cell 240 is arranged over a single cell row (e.g., one SC row 210); the cell 250 is arranged over three cell rows (e.g., two TC rows 201 and one SC row 203); the cell 260 is arranged over two cell rows (e.g., one TC row 201 and one SC row 203); the cell 270 is arranged over a single cell row (e.g., one SC row 203); the cell 280 is arranged over a single cell row (e.g., one SC row 203); and the cell 290 is arranged over a single cell row (e.g., one TC row 201).

Each cell can correspond to a circuit (e.g., a logic gate, a logic circuit). For example, the cell 220 may correspond to a single-stage inverter; the cell 230 may correspond to a multi-stage NAND gate; the cell 240 may correspond to a multi-stage inverter; the cell 250 may correspond to another multi-stage inverter; the cell 260 may correspond to a flip-flop circuit; the cell 270 may correspond to an AND-OR-Inverter (AOI) logic circuit; the cell 280 may correspond to an OR-AND-Inverter (OAI) logic circuit; and the cell 290 may correspond to another AND-OR-Inverter (AOI) logic circuit.

Each of the cells can correspond to at least one layout that has a number of patterns overlapping with the active region(s) in the corresponding cell row. Some of the patterns may be configured to form features/structures on the front side of the substrate (herein "front side patterns"), while some of the patterns may be configured to form features/structures on the back side of the substrate (herein "back side patterns"). The layout of each cell, occupying a portion of real estate of the layout design 200, can thus have a portion of one or more of the patterns shown in FIG. 2.

In the following discussions, the cell 260 (corresponding to a flip-flop circuit placed over one SC row and one TC row), cell 270 (corresponding to an AOI logic circuit placed over one SC row), and cell 290 (corresponding to an AOI logic circuit placed over one TC row) are selected as representative examples to illustrate both of their respective front side and back side patterns, while the cell 250 (corresponding to a multi-stage inverter) and the cell 280 (corresponding to an OAI logic circuit placed over one SC row) are selected as a representative example to illustrate their respective back side patterns.

Figure 4:
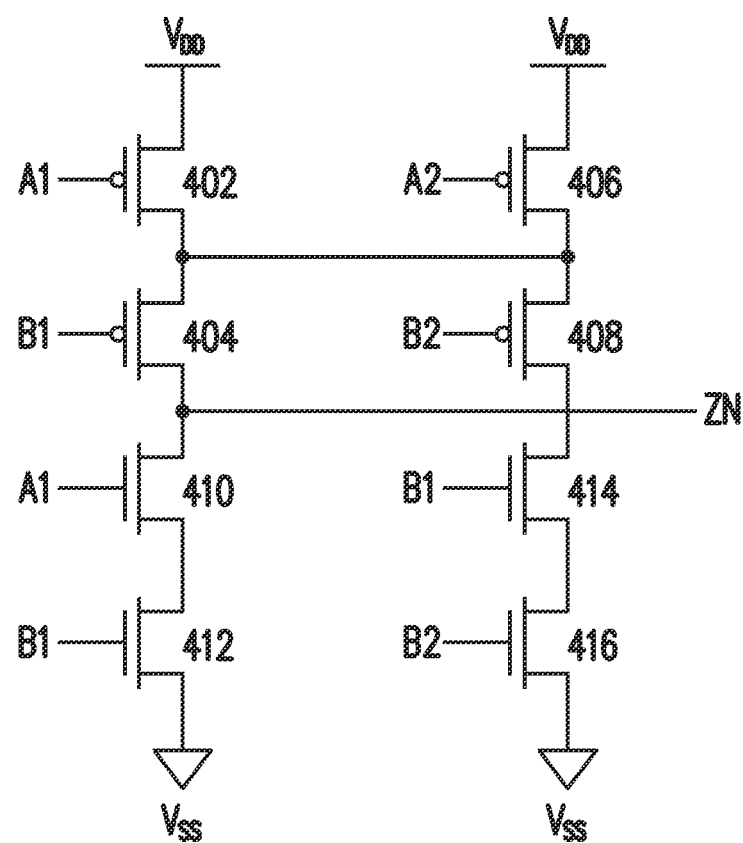
FIG. 4 illustrates a circuit diagram of an example AOI logic circuit, in accordance with some embodiments.

Referring to FIG. 4, a circuit diagram of an example circuit 400 is depicted. The circuit 400 includes an AND-OR-Inverter (AOI) logic circuit. The AOI logic circuit is generally constructed from the combination of one or more AND gates followed by a NOR gate. As shown in FIG. 4, the circuit 400 has four inputs: A1, A2, B1, and B2; and one output ZN that configured to perform the following Boolean function: $\overline{(A1 \wedge A2) \vee (B1 \wedge B2)}$. To perform the function, the circuit 400 can include eight transistors 402, 404, 406, 408, 410, 412, 414, and 416 electrically coupled to one another and between the power supply voltages VDD and VSS. The transistors 402 to 408 can be each implemented as a p-type transistor; and the transistors 410 to 416 can be each implemented as an n-type transistor. However, it is understood that each of the transistors 402 to 416 can be implemented as any of various other conduction type of transistor.

Figure 5A:
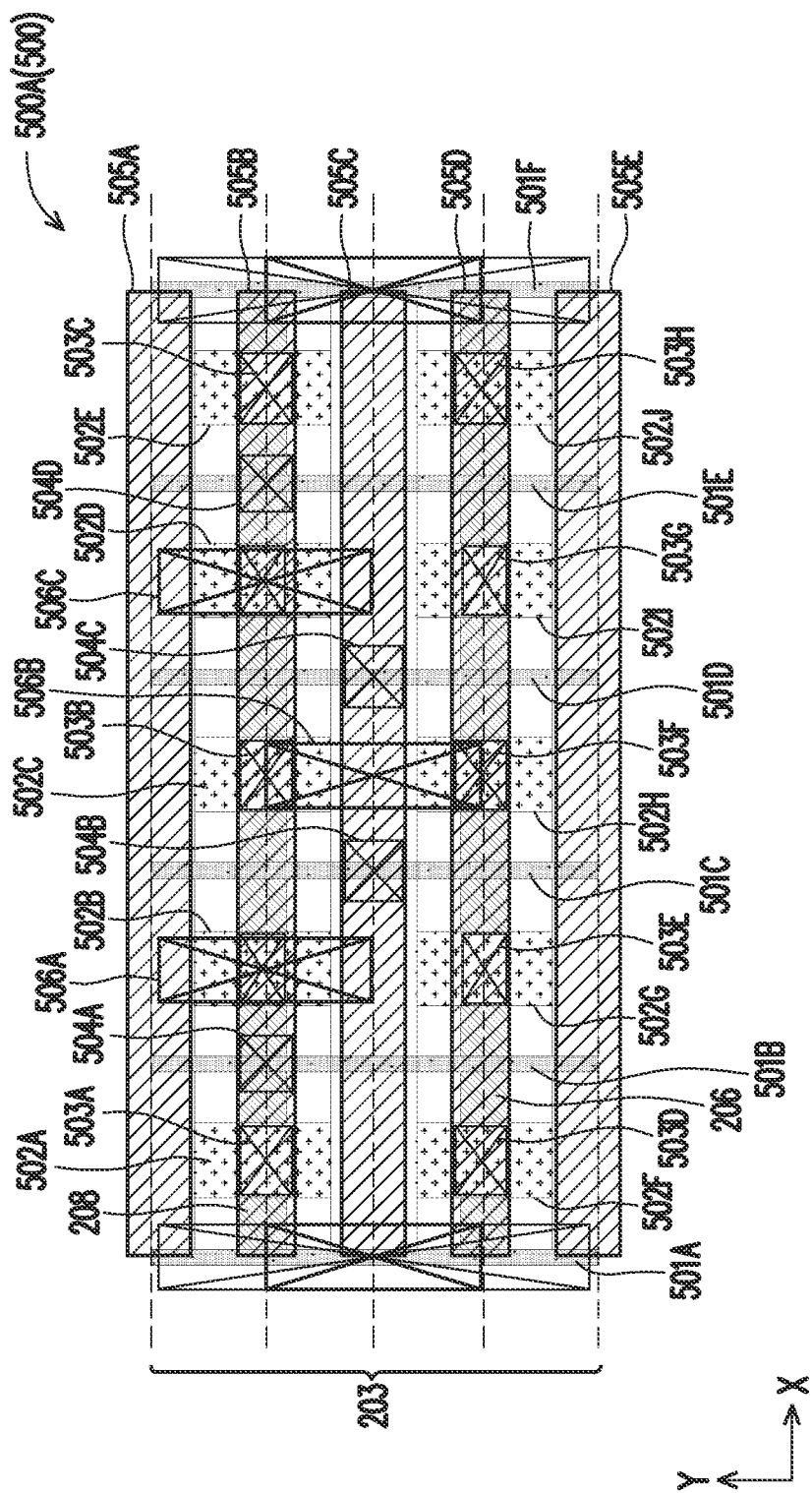
FIGS. 5A, 5B, and 5C illustrate various layout levels of a cell that corresponds to the example AOI logic circuit of FIG. 4, in accordance with some embodiments.
Figure 5B:
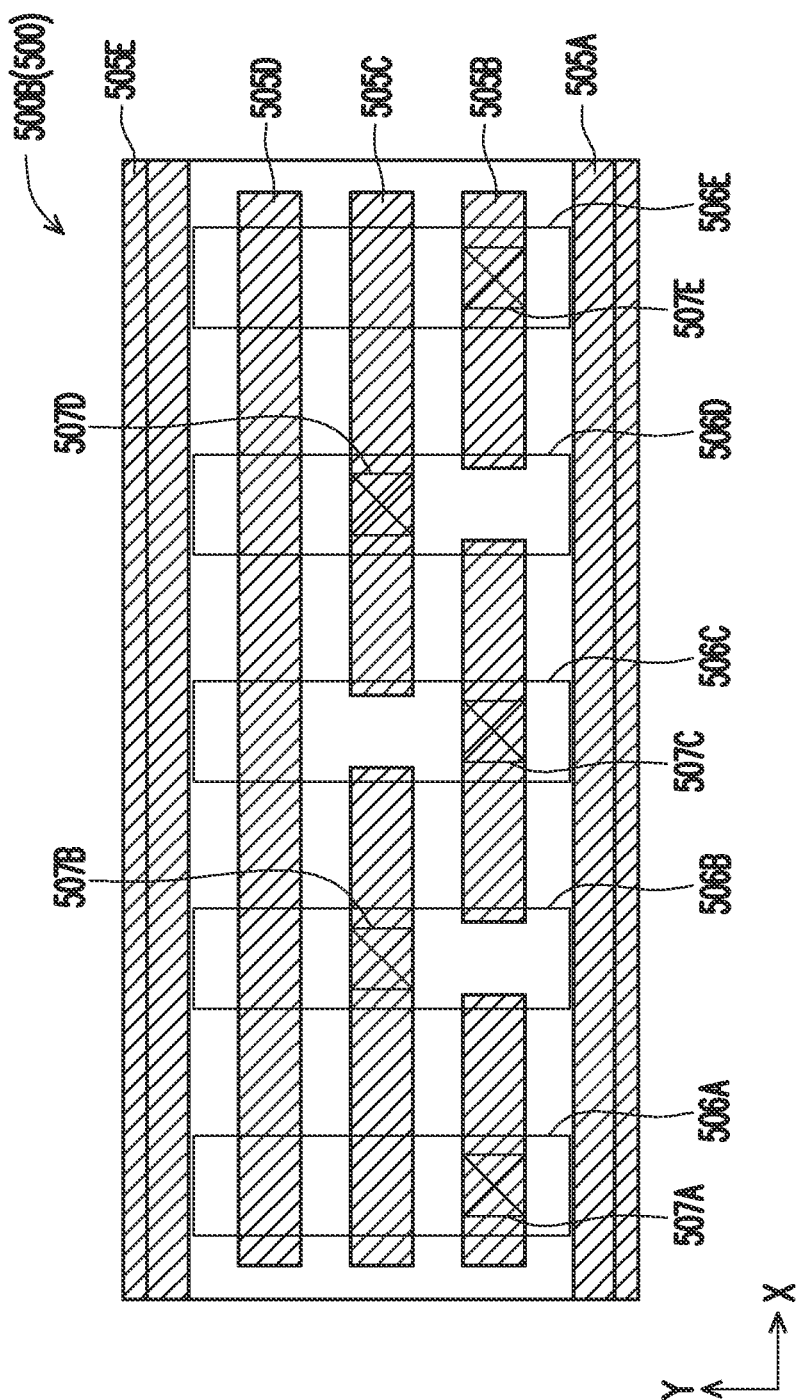
Figure 5C:
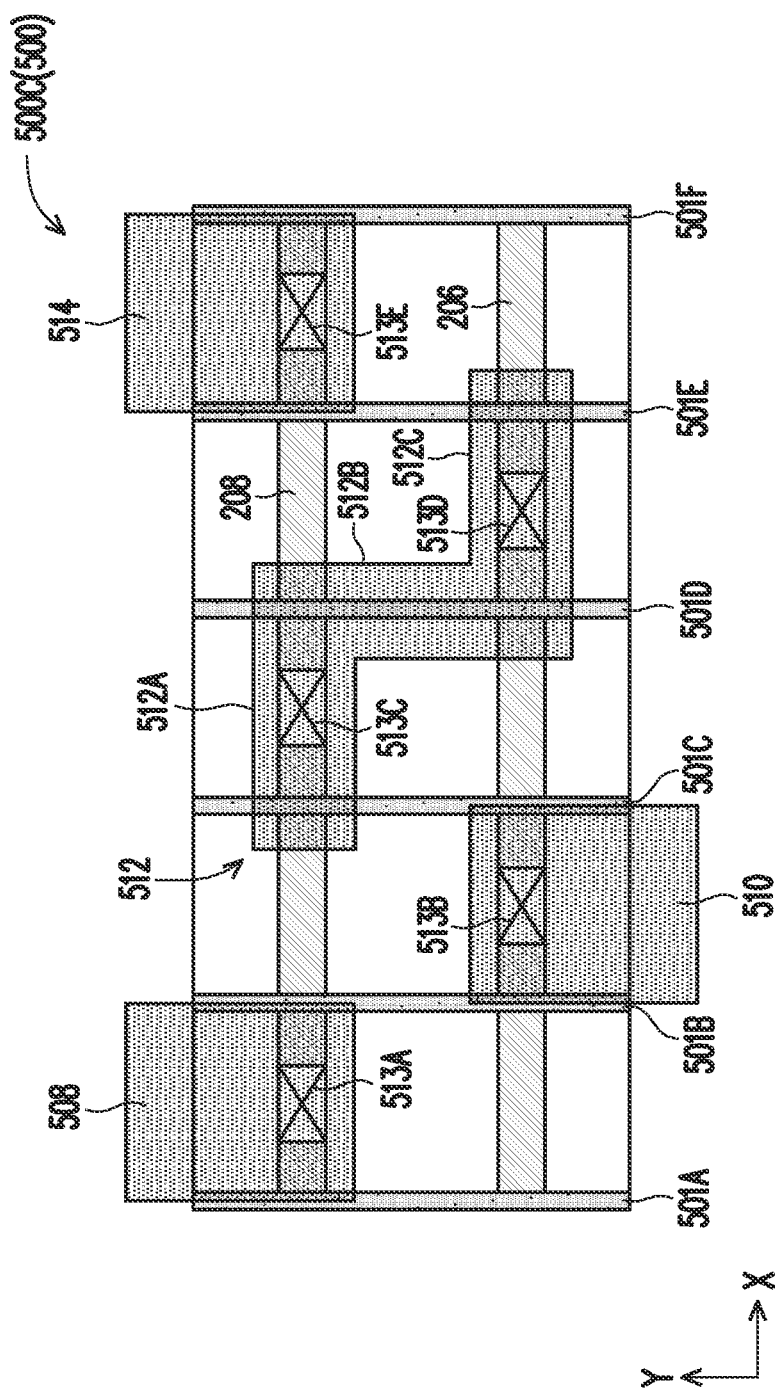
Figure 6A:
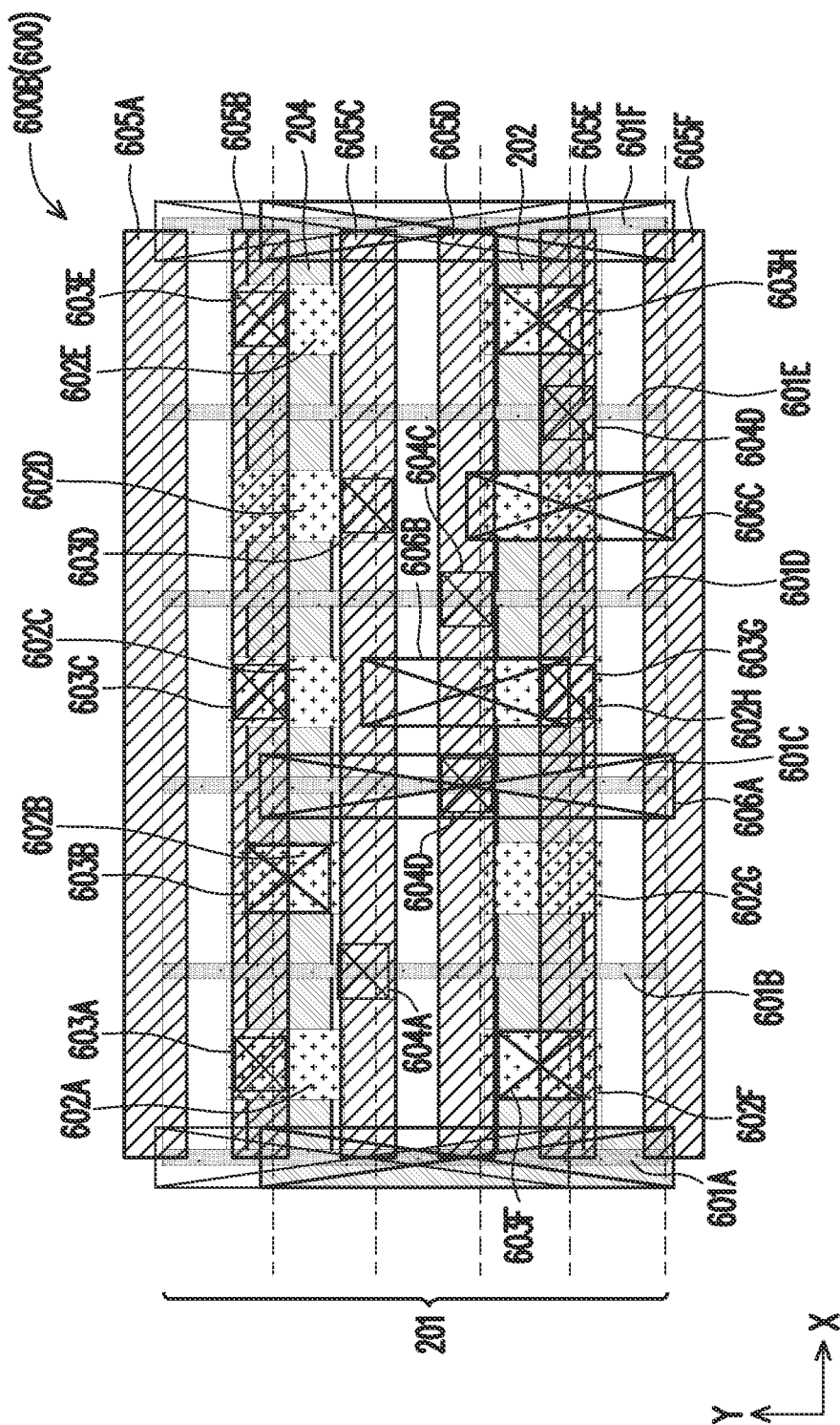
FIGS. 6A, 6B, and 6C illustrate various layout levels of another cell that corresponds to the example AOI logic circuit of FIG. 4, in accordance with some embodiments.
Figure 6B:
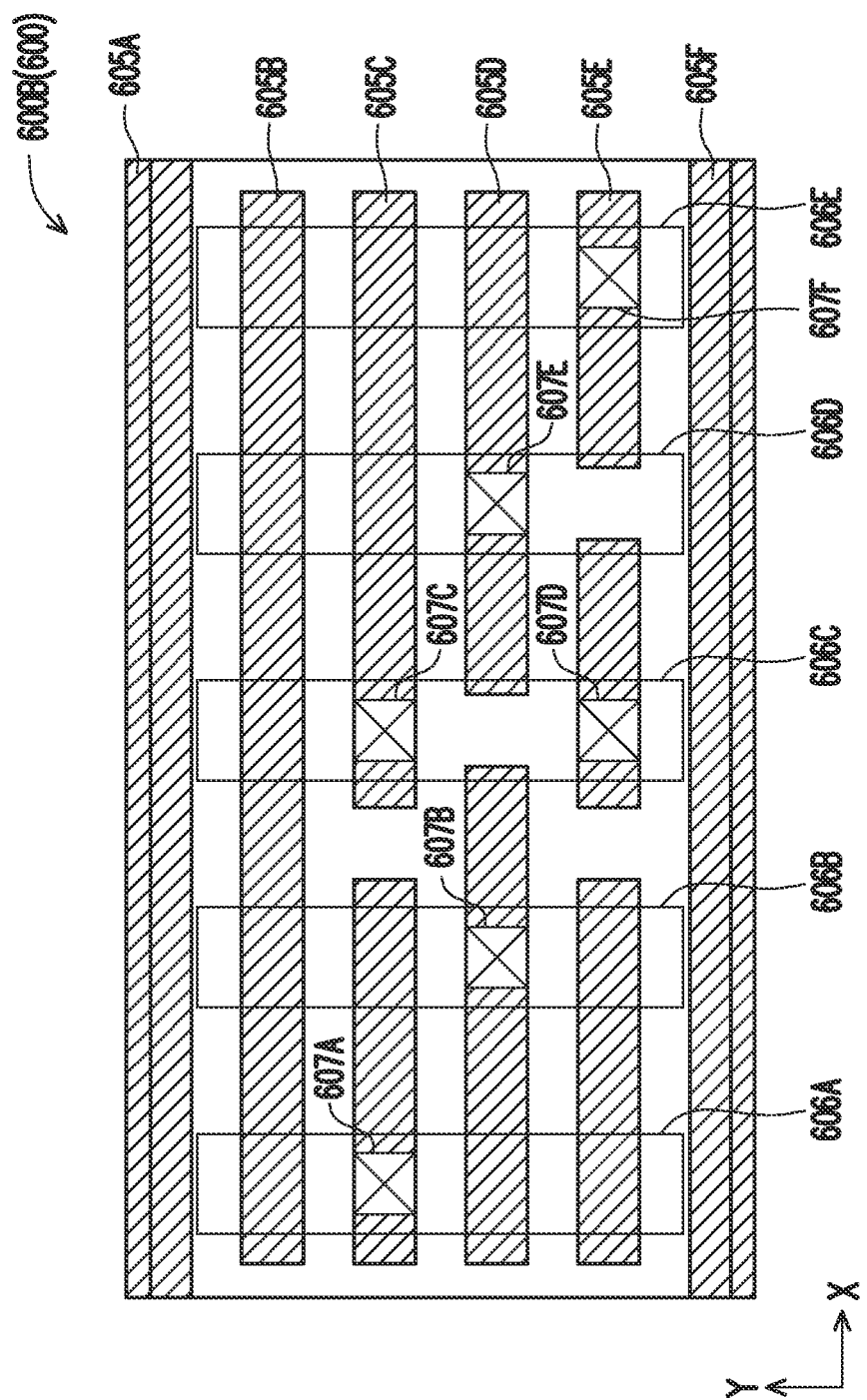
Figure 6C:
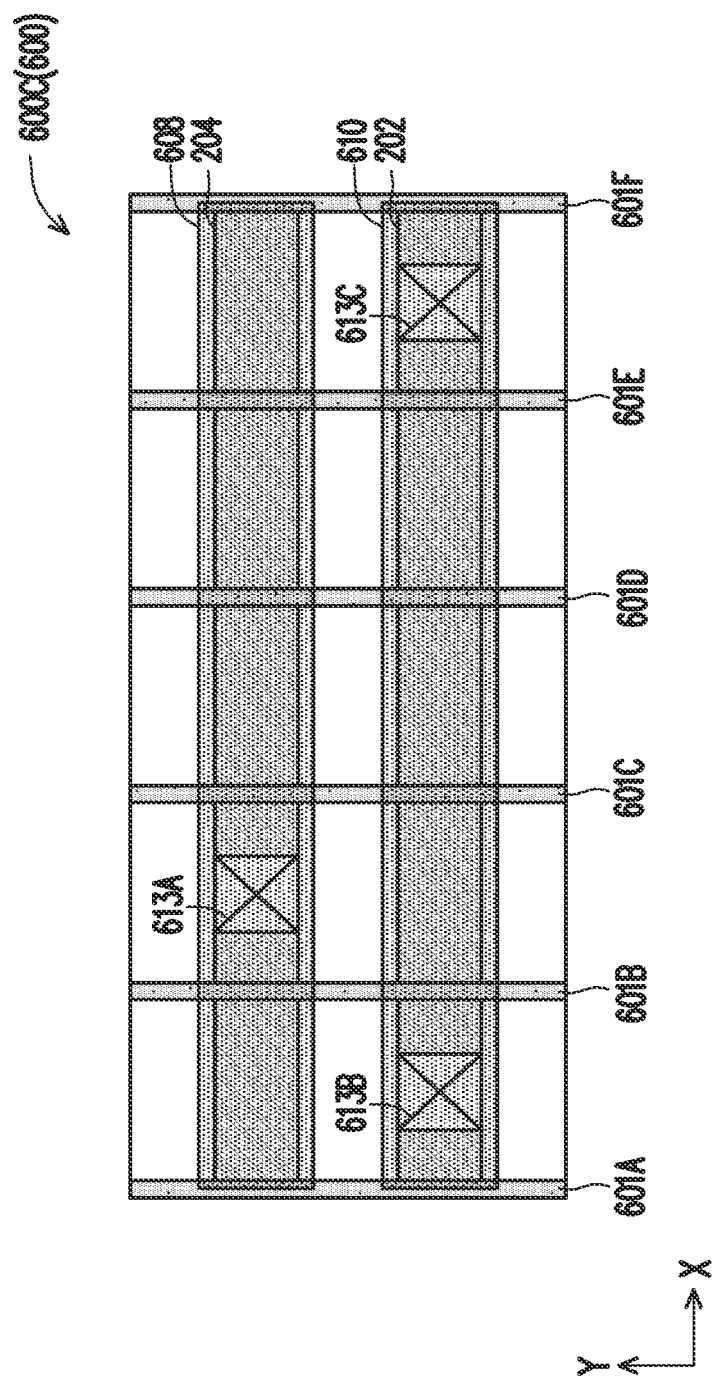

FIGS. 5A-5B and 5C illustrate a layout design 500 of a cell that corresponds to the AOI logic circuit 400 (FIG. 4) to be placed over the SC (short cell) row 203, e.g., the cell 270 of FIG. 2. FIGS. 6A-6B and 6C illustrate a layout design 600 of a cell that corresponds to the AOI logic circuit 400 (FIG. 4) to be placed over the TC (tall cell) row 201, e.g., the cell 290 of FIG. 2.

The layout design 500 of FIGS. 5A-C depict various layout levels of the cell 270, two of which include patterns to form structures/feature on the front side of the substrate, and one of which includes patterns to form structures/feature on the back side of the substrate. Similarly, the layout design 600 of FIGS. 6A-C depict various layout levels of the cell 290, two of which include patterns to form structures/feature on the front side of the substrate, and one of which includes patterns to form structures/feature on the back side of the substrate. It is noted that the layout designs 500 and 600 shown in FIGS. 5A-C and 6A-C are viewed from their top, and thus, in FIGS. 5A-C and 6A-C, the patterns to form the front side features/structures are on top of the patterns to form the back side features/structures.

Referring first to FIG. 5A, a first layout level 500A of the layout design 500, which includes a number of patterns to form a number of active regions and a number of interconnect structures on the front side of the substrate, is shown, in accordance with various embodiments.

As shown, the first layout level 500A includes the active regions (patterns) 206 and 208, with a number of patterns 501A, 501B, 501C, 501D, 501E, and 501F extending along the Y axis to cross the active regions 206 and 208. The patterns 501A to 501F are configured to form gate structures, hereinafter "gate structure 501A," "gate structure 501B," "gate structure 501C," "gate structure 501D," "gate structure 501E," and "gate structure 501F," respectively. The gate structure 501A may be disposed along or over a first boundary of the layout design 500 (or the cell), and the gate structure 501F may be disposed along or over a second boundary of the layout design 500 (or the cell). The gate structures 501A and 501F may not provide an electrical or conductive path, and may prevent or at least reduce/minimize current leakage across components between which the gate structures 501A and 501F are located. The gate structures 501A and 501F can include dummy polysilicon lines, which are sometimes referred to as PODEs. Each of the remaining gate structures 501B to 501E, formed of one or more conductive materials (e.g., polysilicon(s), metal(s)), can overlay respective portions of the active regions 206 and 208 to define one or more of the transistors 402-416 (shown in FIG. 4). As a representative example, the gate structure 501B can define a gate of the transistor 412, and the portions of the active region 208 that are disposed on the left-hand side and right-hand side of the gate structure 501B can define a source and drain of the transistor 412, respectively.

The first layout level 500A includes patterns 502A, 502B, 502C, 502D, 502E, 502F, 502G, 502H, 502I, and 502J. The patterns 502A to 502J may each extend along the Y direction, and be configured to form a source/drain interconnect structure (e.g., MDs), hereinafter "MD 502A," "MD 502B," "MD 502C," "MD 502D," "MD 502E," "MD 502F," "MD 502G," "MD 502H," "MD 502I," and "MD 502J." Each of the MDs 502A to 502J may be electrically coupled to the source or drain of a corresponding transistor.

The first layout level 500A includes patterns 503A, 503B, 503C, 503D, 503E, 503F, 503G, and 503H. The patterns 503A to 503H may be configured to form via interconnect structures (e.g., VDs), hereinafter "VD 503A," "VD 503B," "VD 503C," "VD 503D," "VD 503E," "VD 503F," "VD 503G," and "VD 503H." Each of the VDs 503A to 503H may extend along a vertical direction (e.g., a direction perpendicular to the X axis and the Y axis) by a respective height to electrically couple a corresponding MD to an interconnect structure.

The first layout level 500A includes patterns 504A, 504B, 504C, and 504D. The patterns 504A to 504D may be configured to form via interconnect structures (e.g., VGs), hereinafter "VG 504A," "VG 504B," "VG 504C," and "VG 504D." Each of the VGs 504A to 504D may extend along a vertical direction (e.g., a direction perpendicular to the X axis and the Y axis) by a respective height to electrically couple a corresponding gate structure to an interconnect structure.

The first layout level 500A includes patterns 505A, 505B, 505C, 505D, and 505E. The patterns 505A to 505E may each extend along the X axis and be configured to form an interconnect structure in a bottommost metallization layer over the front side of substrate (e.g., an M0 layer). The patterns 505A through 505E are herein referred to as "M0 track 505A," "M0 track 505B," "M0 track 505C," "M0 track 505D" and "M0 track 505E," respectively.

In some embodiments, the M0 track 505A, disposed along or over a third boundary of the layout design (cell), may be configured to carry a power supply voltage (e.g., VDD), and function as a shielding metal track. The M0 track 505E, disposed along or over a fourth boundary of the layout design (cell), may be configured to carry a supply voltage (e.g., VSS), and function as a shielding metal track. Such shielding metal tracks may not be connected to any of the active regions, in some embodiments. To connect the transistors as shown in FIG. 4, some of the M0 tracks may be "cut" into a plurality of portions by one or more M0 cut patterns. For example, the M0 track 505B may be cut into a number of portions by cut patterns 506A and 506C; and the M0 track 505C may be cut into a number of portions by a cut pattern 506B.

Referring next to FIG. 5B, a second layout level 500B of the layout design 500, which includes a number of patterns to form a number of interconnect structures on the front side of the substrate, is shown, in accordance with various embodiments. For purpose of reference, the M0 tracks 505A to 505E (FIG. 5A) are again shown in FIG. 5B.

The second layout level 500B includes patterns 506A, 506B, 506C, 506D, and 506E. The patterns 506A to 506E may each extend along the Y axis and be configured be configured to form an interconnect structure at the next upper metallization layer (e.g., an M1 layer). The patterns 506A through 506E are herein referred to as "M1 track 506A," "M1 track 506B," "M1 track 506C," "M1 track 506D" and "M1 track 506E," respectively.

Each of the M1 tracks 506A to 506E may be electrically coupled to at least one M0 track, through a via structure (e.g., V0), to either receive one of the inputs A1, A2, B1, and B2 (FIG. 4), or provide the output ZN (FIG. 4). For example, the M1 track 506A is electrically coupled to a cut portion of the M0 track 505B through a via structure 507A (hereinafter "V0 507A") to receive the input A2; the M1 track 506B is electrically coupled to a cut portion of the M0 track 505C through a via structure 507B (hereinafter "V0 507B") to receive the input A1; the M1 track 506C is electrically coupled to a cut portion of the M0 track 505B through a via structure 507C (hereinafter "V0 507C") to provide the output ZN; the M1 track 506D is electrically coupled to a cut portion of the M0 track 505C through a via structure 507D (hereinafter "V0 507D") to receive the input B1; and the M1 track 506E is electrically coupled to a cut portion of the M0 track 505B through a via structure 507E (hereinafter "V0 507E") to receive the input B2.

Referring then to FIG. 5C, a third layout level 500C of the layout design 500, which includes a number of patterns to form a number of interconnect structures on the back side of the substrate, is shown, in accordance with various embodiments. For purpose of reference, the gate structures 501A to 501F and the active regions 206 to 208 formed on the front side (FIG. 5A) are again shown in FIG. 5C.

The third layout level 500C includes patterns 508, 510, 512, and 514. The patterns 508, 510, and 514 can be each an example of the interconnect structure pattern 214 or 216; and the pattern 512 can be an example of the interconnect structure pattern 218, shown in FIG. 2. The patterns 508 to 514 may each be configured be configured to form an interconnect structure at the bottommost metallization layer over a back side of the substrate (e.g., a BM0 layer). The patterns 508 through 514 are herein referred to as "BM0 track 508," "BM0 track 510," "BM0 track 512," and "BM0 track 514," respectively. In some embodiments, the BM0 tracks 508 and 514 can each carry a first power supply voltage (e.g., VSS) and the BM0 track 510 can carry a second power supply voltage (e.g., VDD), while the BM0 track 512 may carry a signal other than any of the power supply voltages. The BM0 tracks 508, 510, and 514 may each be an implementation of the SD power line 214 or 216, and the BM0 track 512 may be an implementation of the MD signal line 218, as discussed with respect to the layout design 200 of FIG. 2.

The BM0 track 508 can electrically couple to a portion of the active region 208 (e.g., a source of the transistor 412 of FIG. 4) through a back side via structure, formed by a pattern 513A (hereinafter "BV0 513A"); the BM0 track 510 can electrically couple to a portion of the active region 206 (e.g., respective sources of the transistors 402 and 406 of FIG. 4) through a back side via structure, formed by a pattern 513B (hereinafter "BV0 513B"); and the BM0 track 514 can electrically couple to a portion of the active region 208 (e.g., a source of the transistor 416 of FIG. 4) through a back side via structure, formed by a pattern 513E (hereinafter "BV0 513E"). As such, each of the BM0 tracks 508, 510, and 514 can deliver or otherwise provide either VDD or VSS to the corresponding node, per the design of the circuit.

The BM0 track 512 can electrically couple a portion of the active region 208 (e.g., e.g., respective drains of the transistors 410 and 414 as shown in FIG. 4) to a portion of the active region 206 (e.g., respective drains of the transistors 404 and 408 as shown in FIG. 4) through a back side via structure formed by a pattern 513C (hereinafter "VB 513C") and a back side via structure formed by a pattern 513D (hereinafter "VB 513D"). Specifically, the BM0 track 512 has three portions 512A, 512B, and 512C. The portion 512A overlaps with the active region 208 by extending along the same direction, and the VB 513C is further disposed between the active region 208 and the portion 512A; and the portion 512C overlaps with the active region 206 by extending along the same direction, and the VB 513D is further disposed between the active region 206 and the portion 512C. Extending along a different direction, the portion 512B can connect the portions 512A and 512C so as to couple the corresponding (internal) nodes to each other, per the design of the circuit.

Referring now to FIG. 6A, a first layout level 600A of the layout design 600, which includes a number of patterns to form a number of active regions and a number of interconnect structures on the front side of the substrate, is shown, in accordance with various embodiments.

As shown, the first layout level 600A includes the active regions (patterns) 202 and 204, with a number of patterns 601A, 601B, 601C, 601D, 601E, and 601F extending along the Y axis to cross the active regions 202 and 204. The patterns 601A to 601F are configured to form gate structures, hereinafter "gate structure 601A," "gate structure 601B," "gate structure 601C," "gate structure 601D," "gate structure 601E," and "gate structure 601F," respectively. The gate structure 601A may be disposed along or over a first boundary of the layout design 600 (or the cell), and the gate structure 601F may be disposed along or over a second boundary of the layout design 600 (or the cell). The gate structures 601A and 601F may not provide an electrical or conductive path, and may prevent or at least reduce/minimize current leakage across components between which the gate structures 601A and 601F are located. The gate structures 601A and 601F can include dummy polysilicon lines, which are sometimes referred to as PODEs. Each of the remaining gate structures 601B to 601E, formed of one or more conductive materials (e.g., polysilicon(s), metal(s)), can overlay respective portions of the active regions 202 and 204 to define one or more of the transistors 402-416 (shown in FIG. 4). As a representative example, example, the gate structure 601B can define a gate of the transistor 412, and the portions of the active region 204 that are disposed on the left-hand side and right-hand side of the gate structure 601B can define a source and drain of the transistor 412, respectively.

The first layout level 600A includes patterns 602A, 602B, 602C, 602D, 602E, 602F, 602G, 602H, 602I, and 602J. The patterns 602A to 602J may each extend along the Y direction, and be configured to form a source/drain interconnect structure (e.g., MDs), hereinafter "MD 602A," "MD 602B," "MD 602C," "MD 602D," "MD 602E," "MD 602F," "MD 602G," "MD 602H," "MD 602I," and "MD 602J" Each of the MDs 602A to 602J may be electrically coupled to the source or drain of a corresponding transistor.

The first layout level 600A includes patterns 603A, 603B, 603C, 603D, 603E, 603F, 603G, and 603H. The patterns 603A to 603H may be configured to form via interconnect structures (e.g., VDs), hereinafter "VD 603A," "VD 603B," "VD 603C," "VD 603D," "VD 603E," "VD 603F," "VD 603G," and "VD 603H." Each of the VDs 603A to 603H may extend along a vertical direction (e.g., a direction perpendicular to the X axis and the Y axis) by a respective height to electrically couple a corresponding MD to an interconnect structure.

The first layout level 600A includes patterns 604A, 604B, 604C, and 604D. The patterns 604A to 604D may be configured to form via interconnect structures (e.g., VGs), hereinafter "VG 604A," "VG 604B," "VG 604C," and "VG 604D." Each of the VGs 604A to 604D may extend along a vertical direction (e.g., a direction perpendicular to the X axis and the Y axis) by a respective height to electrically couple a corresponding gate structure to an interconnect structure.

The first layout level 600A includes patterns 605A, 605B, 605C, 605D, 605E, and 605F. The patterns 605A to 605F may each extend along the X axis and be configured to form an interconnect structure in a bottommost metallization layer over the front side of substrate (e.g., an M0 layer). The patterns 605A through 605F are herein referred to as "M0 track 605A," "M0 track 605B," "M0 track 605C," "M0 track 605D," "M0 track 605E," and "M0 track 605F," respectively.

In some embodiments, the M0 track 605A, disposed along or over a third boundary of the layout design (cell), may be configured to carry a power supply voltage (e.g., VDD), and function as a shielding metal track. The M0 track 605F, disposed along or over a fourth boundary of the layout design (cell), may be configured to carry a supply voltage (e.g., VSS), and function as a shielding metal track. Such shielding metal tracks may not be connected to any of the active regions, in some embodiments. To connect the transistors as shown in FIG. 4, some of the M0 tracks may be "cut" into a plurality of portions by one or more M0 cut patterns. For example, the M0 track 605C and 605E may be respectively cut into a number of portions by cut patterns 606A; the M0 track 605D may be cut into a number of portions by a cut pattern 606B; and the M0 track 605E may be cut into a number of portions by a cut pattern 606C.

Referring next to FIG. 6B, a second layout level 600B of the layout design 600, which includes a number of patterns to form a number of interconnect structures on the front side of the substrate, is shown, in accordance with various embodiments. For purpose of reference, the M0 tracks 605A to 605F (FIG. 6A) are again shown in FIG. 6B.

The second layout level 600B includes patterns 606A, 606B, 606C, 606D, and 606E. The patterns 606A to 606E may each extend along the Y axis and be configured be configured to form an interconnect structure at the next upper metallization layer (e.g., an M1 layer). The patterns 606A through 606E are herein referred to as "M1 track 606A," "M1 track 606B," "M1 track 606C," "M1 track 606D" and "M1 track 606E," respectively.

Each of the M1 tracks 606A to 606E may be electrically coupled to at least one M0 track, through a via structure (e.g., V0), to either receive one of the inputs A1, A2, B1, and B2 (FIG. 4), or provide the output ZN (FIG. 4). For example, the M1 track 606A is electrically coupled to a cut portion of the M0 track 605C through a via structure 607A (hereinafter "V0 607A") to receive the input A2; the M1 track 606B is electrically coupled to a cut portion of the M0 track 605D through a via structure 607B (hereinafter "V0 607B") to receive the input A1; the M1 track 606C is electrically coupled to a cut portion of the M0 track 605C and a cut portion of the M0 track 605E through via structures 607C (hereinafter "V0 607C") and 607D (hereinafter "V0 607D"), respectively, to provide the output ZN; the M1 track 606D is electrically coupled to a cut portion of the M0 track 605D through a via structure 607E (hereinafter "V0 607E") to receive the input B1; and the M1 track 606E is electrically coupled to a cut portion of the M0 track 605B through a via structure 607F (hereinafter "V0 607F") to receive the input B2.

Referring then to FIG. 6C, a third layout level 600C of the layout design 600, which includes a number of patterns to form a number of interconnect structures on the back side of the substrate, is shown, in accordance with various embodiments. For purpose of reference, the gate structures 601A to 601F and the active regions 202 to 204 formed on the front side (FIG. 6A) are again shown in FIG. 6C.

The third layout level 600C includes patterns 608 and 610. The patterns 608 and 610 can be each an example of a portion of the interconnect structure pattern 210 or 212, shown in FIG. 2. The patterns 608 and 610 may each be configured be configured to form an interconnect structure at the bottommost metallization layer over a back side of the substrate (e.g., a BM0 layer). The patterns 608 through 610 are herein referred to as "BM0 track 608" and "BM0 track 610," respectively. In some embodiments, the BM0 track 608 can carry a first power supply voltage (e.g., VDD) and the BM0 track 610 can carry a second power supply voltage (e.g., VSS). The BM0 tracks 608 and 610 may each be an implementation of the SD power line 210 or 212, as discussed with respect to the layout design 200 of FIG. 2.

The BM0 track 608 can electrically couple to a portion of the active region 204 (e.g., respective sources of the transistors 402 and 406 of FIG. 4) through a back side via structure, formed by a pattern 613A (hereinafter "VB 613A"); and the BM0 track 610 can electrically couple to a portion of the active region 202 (e.g., a source of the transistor 412 of FIG. 4) through a back side via structure, formed by a pattern 613B (hereinafter "VB 613B") and to a portion of the active region 202 (e.g., a source of the transistor 416 of FIG. 4) through a back side via structure, formed by a pattern 613C (hereinafter "VB 613C"). As such, each of the BM0 tracks 608 and 610 can deliver or otherwise provide either VDD or VSS to the corresponding node, per the design of the circuit.

Figure 7:
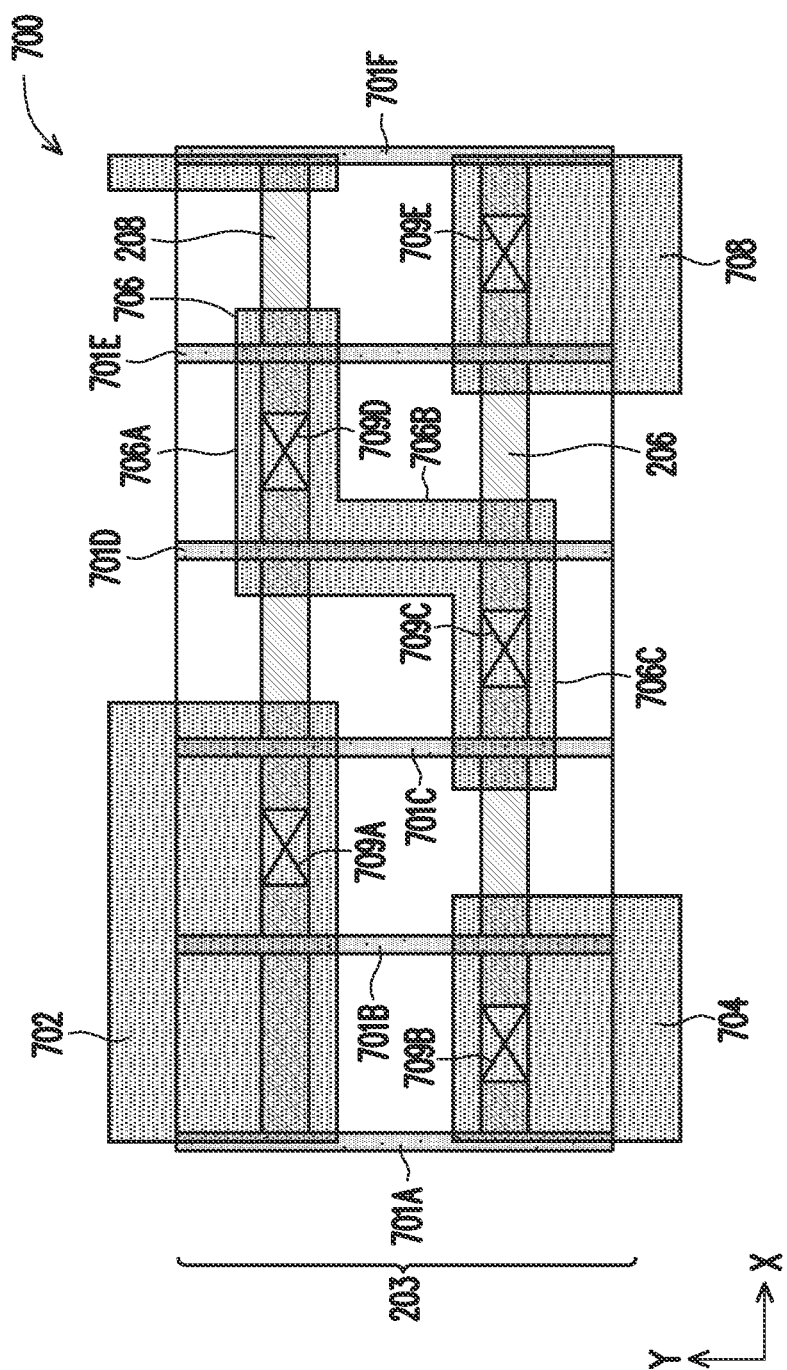
FIG. 7 illustrates a layout level of a cell that corresponds to an example OAI logic circuit, in accordance with some embodiments.
Figure 8:
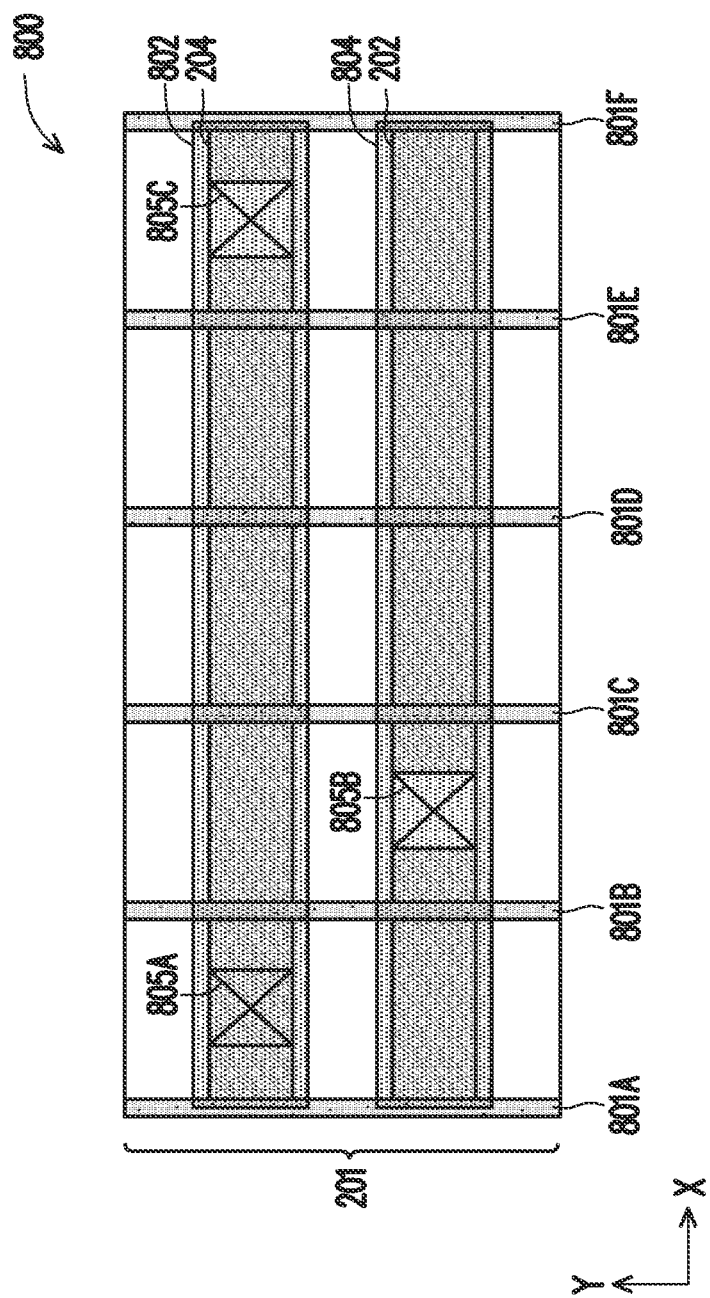
FIG. 8 illustrates a layout level of another cell that corresponds to the example OAI logic circuit, in accordance with some embodiments.

FIG. 7 illustrates a layout design 700 of a cell that corresponds to the OAI logic circuit to be placed over the SC (short cell) row 203, e.g., the cell 290 of FIG. 2. FIG. 8 illustrates a layout design 800 of a cell that corresponds to the OAI logic circuit to be placed over the TC (tall cell) row 201. The OAI logic circuit is similar to the AOI logic circuit discussed with respect to FIG. 4 except that the internal connection between the p-type transistors is replaced with an internal connection between the n-type transistors, which may not substantially change the patterns to form the front side structures/features. Thus, in FIGS. 7 and 8, the layout designs 700 and 800 each include a layout level showing patterns to form the back side interconnect structures, while patterns to form active regions and gate structures on the front side are present for reference.

Referring first to FIG. 7, with active regions 206-208 and gate structures 701A through 701F present, the layout design (level) 700 includes patterns 702, 704, 706, and 708. The patterns 702, 704, and 708 can be each an example of the interconnect structure pattern 214 or 216; and the pattern 706 can be an example of the interconnect structure pattern 218, shown in FIG. 2. The patterns 702 to 708 may each be configured be configured to form an interconnect structure at the bottommost metallization layer over a back side of the substrate (e.g., a BM0 layer). The patterns 702 through 708 are herein referred to as "BM0 track 702," "BM0 track 704," "BM0 track 706," and "BM0 track 708," respectively. In some embodiments, the BM0 track 702 can carry a first power supply voltage (e.g., VSS) and the BM0 tracks 704 and 708 can each carry a second power supply voltage (e.g., VDD), while the BM0 track 706 may carry a signal other than any of the power supply voltages. The BM0 tracks 702, 704, and 708 may each be an implementation of the SD power line 214 or 216, and the BM0 track 706 may be an implementation of the MD signal line 218, as discussed with respect to the layout design 200 of FIG. 2.

The BM0 track 702 can electrically couple to a portion of the active region 208 through a back side via structure, formed by a pattern 709A (hereinafter "VB 709A"); the BM0 track 704 can electrically couple to a portion of the active region 206 through a back side via structure, formed by a pattern 709B (hereinafter "VB 709B"); and the BM0 track 708 can electrically couple to a portion of the active region 206 through a back side via structure, formed by a pattern 709E (hereinafter "VB 709E"). As such, each of the BM0 tracks 702, 704, and 708 can deliver or otherwise provide either VDD or VSS to the corresponding node, per the design of the circuit.

The BM0 track 706 can electrically couple a portion of the active region 206 to a portion of the active region 208 through a back side via structure formed by a pattern 709C (hereinafter "VB 709C") and a back side via structure formed by a pattern 709D (hereinafter "VB 709D"). Specifically, the BM0 track 706 has three portions 706A, 706B, and 706C. The portion 706A overlaps with the active region 208 by extending along the same direction, and the VB 709D is further disposed between the active region 208 and the portion 706A; and the portion 706C overlaps with the active region 206 by extending along the same direction, and the VB 709C is further disposed between the active region 206 and the portion 706C. Extending along a different direction, the portion 706B can connect the portions 706A and 706C so as to couple the corresponding (internal) nodes to each other, per the design of the circuit.

Referring then to FIG. 8, with active regions 202-204 and gate structures 801A through 801F present, the layout design (level) 800 includes patterns 802 and 804. The patterns 802 and 804 can be each an example of a portion of the interconnect structure pattern 210 or 212, shown in FIG. 2. The patterns 802 and 804 may each be configured be configured to form an interconnect structure at the bottommost metallization layer over a back side of the substrate (e.g., a BM0 layer). The patterns 802 and 804 are herein referred to as "BM0 track 802" and "BM0 track 804," respectively. In some embodiments, the BM0 track 802 can carry a first power supply voltage (e.g., VDD) and the BM0 track 804 can carry a second power supply voltage (e.g., VSS). The BM0 tracks 802 and 804 may each be an implementation of the SD power line 210 or 212, as discussed with respect to the layout design 200 of FIG. 2.

The BM0 track 802 can electrically couple to a portion of the active region 204 through a back side via structure, formed by a pattern 805A (hereinafter "VB 805A") and to a portion of the active region 204 through a back side via structure, formed by a pattern 805C (hereinafter "VB 805C"); and the BM0 track 804 can electrically couple to a portion of the active region 202 through a back side via structure, formed by a pattern 805B (hereinafter "VB 805B"). As such, each of the BM0 tracks 802 and 804 can deliver or otherwise provide either VDD or VSS to the corresponding node, per the design of the circuit.

Figure 9:
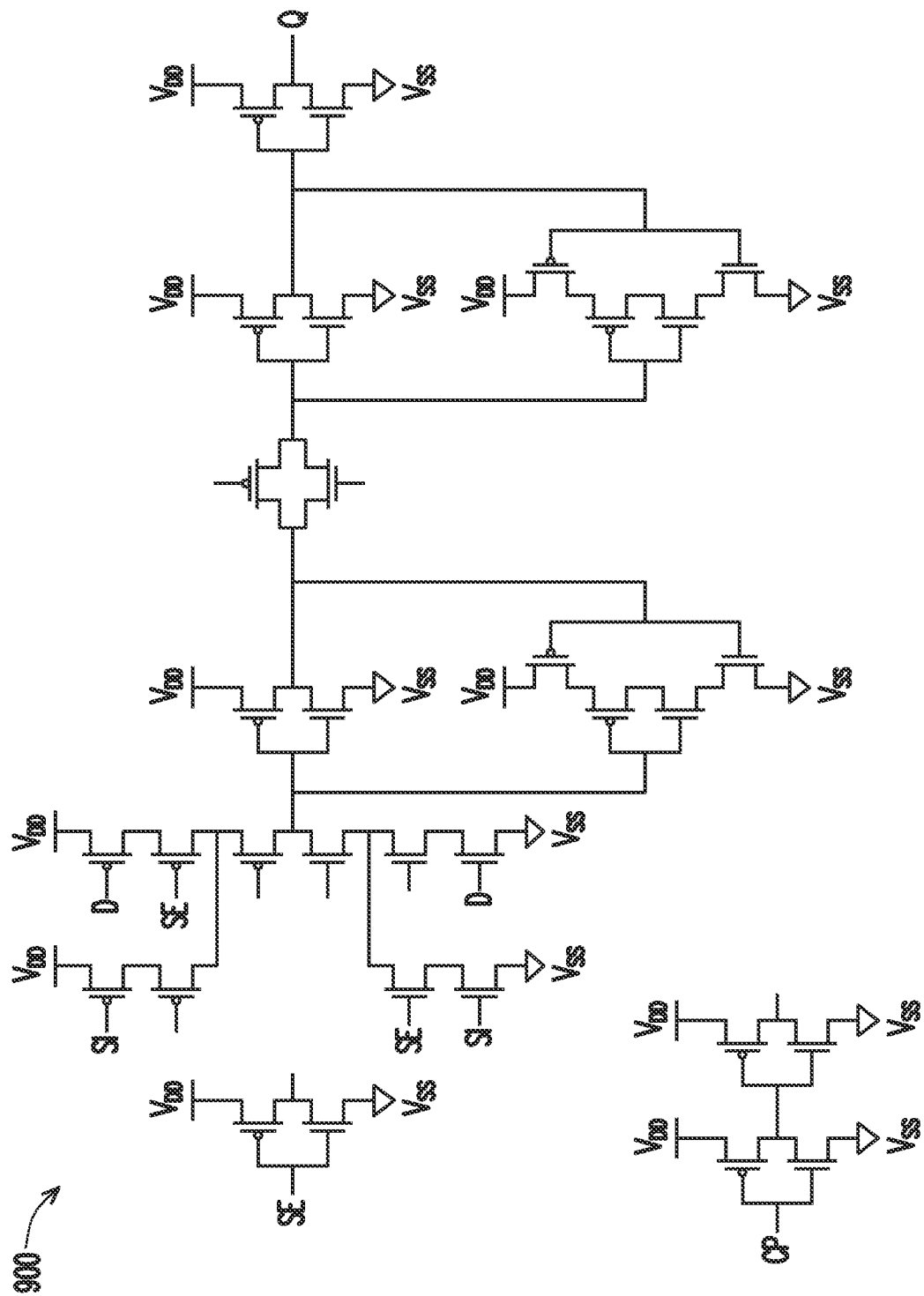
FIG. 9 illustrates a circuit diagram of an example SDF circuit, in accordance with some embodiments.

Referring to FIG. 9, a circuit diagram of an example circuit 900 is depicted. The circuit 900 includes a scan D-flip flop circuit, or a D-flip flop circuit with a scan input (hereinafter "SDF" circuit). The SDF circuit is generally constructed from the combination of a number of transistors, as shown in FIG. 9. The SDF circuit includes a D flip-flop with a multiplexer (MUX) having one input that acts as functional input "D," and the other input that acts as "Scan-In (SI) input." "Scan/Test Enable (SE/TE)" is used to control a selection bit of the MUX. Further, a clock signal is fed through input "CP," and the SDF circuit has output "Q." To perform a function of the SDF circuit (e.g., a D flip-flop that allows its input to come from an alternative source), the transistors are electrically coupled to one another and between the power supply voltages VDD and VSS. As shown in FIG. 9, some of the transistors can be implemented as a p-type transistor, and some of the transistors can be implemented as an n-type transistor. However, it is understood that each of the transistors can be implemented as any of various other conduction type of transistor.

FIGS. 10A, 10B, 10C, and 10D illustrate a layout design 1000 of a cell that corresponds to the SDF circuit 900 (FIG. 9) to be placed over the SC (short cell) row 203 and TC (tall cell) row 201, e.g., the cell 260 of FIG. 2. The layout design 1000 of FIGS. 10A-D depict various layout levels of the cell 260, three of which include patterns to form structures/feature on the front side of the substrate, and one of which includes patterns to form structures/feature on the back side of the substrate. It is noted that the layout design 1000 shown in FIGS. 10A-D are viewed from their top, and thus, in FIGS. 10A-D, the patterns to form the front side features/structures are on top of the patterns to form the back side features/structures.

Figure 10A:
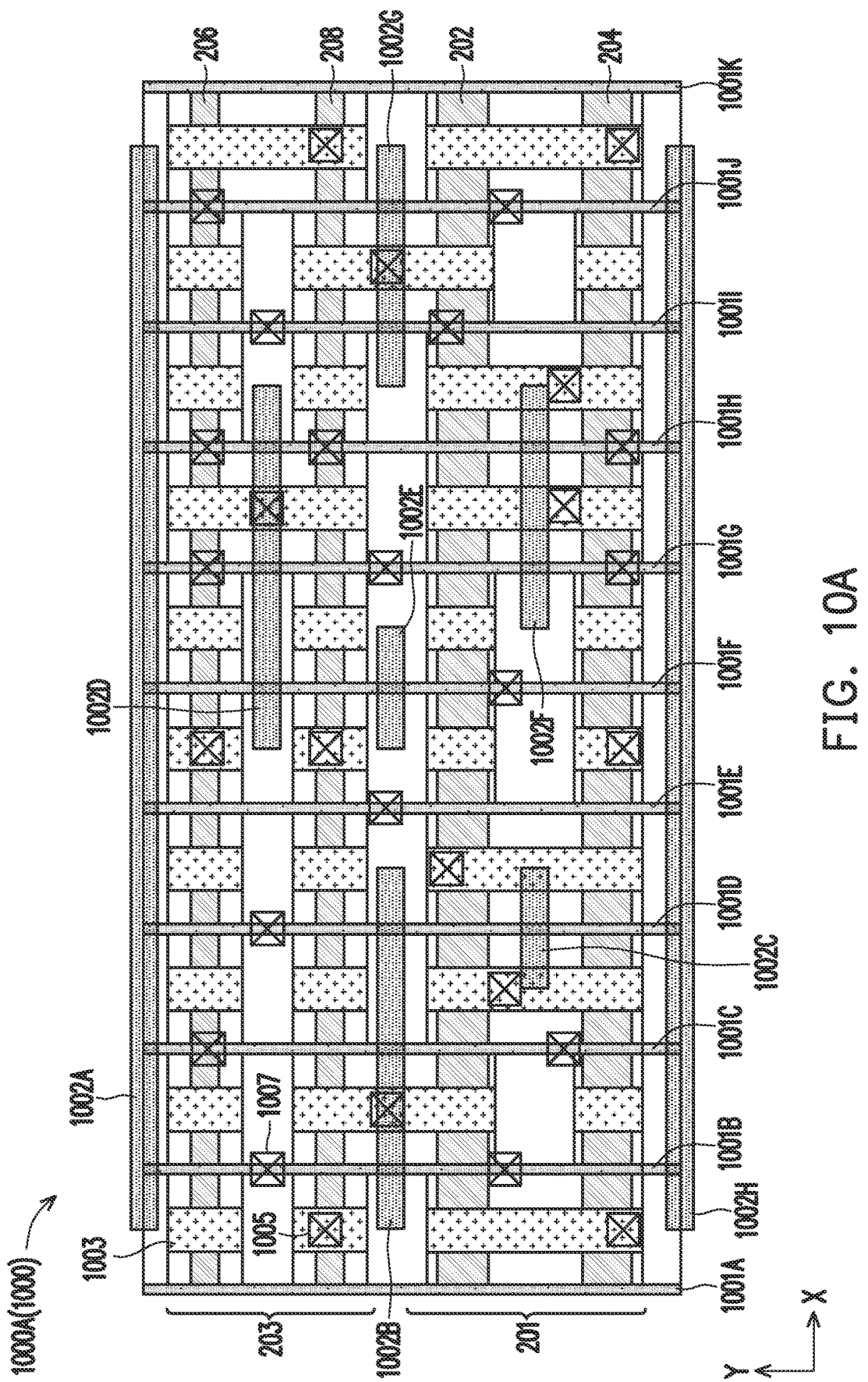
FIGS. 10A, 10B, 10C, and 10D illustrate various layout levels of a cell that corresponds to the example SDF circuit of FIG. 9, in accordance with some embodiments.

Referring first to FIG. 10A, a first layout level 1000A of the layout design 1000, which includes a number of patterns to form a number of active regions and a number of interconnect structures on the front side of the substrate, is shown, in accordance with various embodiments.

As shown, the first layout level 1000A includes the active regions (patterns) 202-204 (of the tall cell row 201) and 2060208 (of the short cell row 203), with a number of patterns 1001A, 1001B, 1001C, 1001D, 1001E, 1001F, 1001G, 1001H, 1001I, 1001J, and 1001K extending along the Y axis to cross the active regions 202 to 208. The patterns 1001A to 1001K are configured to form gate structures, hereinafter "gate structure 1001A," "gate structure 1001B," "gate structure 1001C," "gate structure 1001D," "gate structure 1001E," "gate structure 1001F," "gate structure 1001G," "gate structure 1001H," "gate structure 1001I," "gate structure 1001J," and "gate structure 1001K," respectively.

The gate structure 1001A may be disposed along or over a first boundary of the layout design 1000 (or the cell), and the gate structure 1001K may be disposed along or over a second boundary of the layout design 1000 (or the cell). The gate structures 1001A and 1001K may not provide an electrical or conductive path, and may prevent or at least reduce/minimize current leakage across components between which the gate structures 1001A and 1001K are located. The gate structures 1001A and 1001K can include dummy polysilicon lines, which are sometimes referred to as PODEs. Each of the remaining gate structures 1001B to 1001J, formed of one or more conductive materials (e.g., polysilicon(s), metal(s)), can overlay respective portions of the active regions 202 to 208 to define the transistors of the SDF circuit 900 (shown in FIG. 9).

The first layout level 1000A includes a number of patterns 1003. The patterns 1003 may each extend along the Y direction, and be configured to form a source/drain interconnect structure (e.g., MD), hereinafter "MD 1003." Each of the MDs may be electrically coupled to the source or drain of a corresponding transistor, e.g., the portion of each of the active regions 202 to 208 that is not overlaid by a gate structure.

The first layout level 1000A includes a number of patterns 1005. The patterns 1005 may be each configured to form a via interconnect structure (e.g., VD), hereinafter "VD 1005." Each of the VDs 1005 may extend along a vertical direction (e.g., a direction perpendicular to the X axis and the Y axis) by a respective height to electrically couple a corresponding MD to an interconnect structure.

The first layout level 1000A includes a number of patterns 1007. The patterns 1007 may each be configured to form a via interconnect structures (e.g., VG), hereinafter "VG 1007." Each of the VGs 1007 may extend along a vertical direction (e.g., a direction perpendicular to the X axis and the Y axis) by a respective height to electrically couple a corresponding gate structure to an interconnect structure.

Figure 10B:
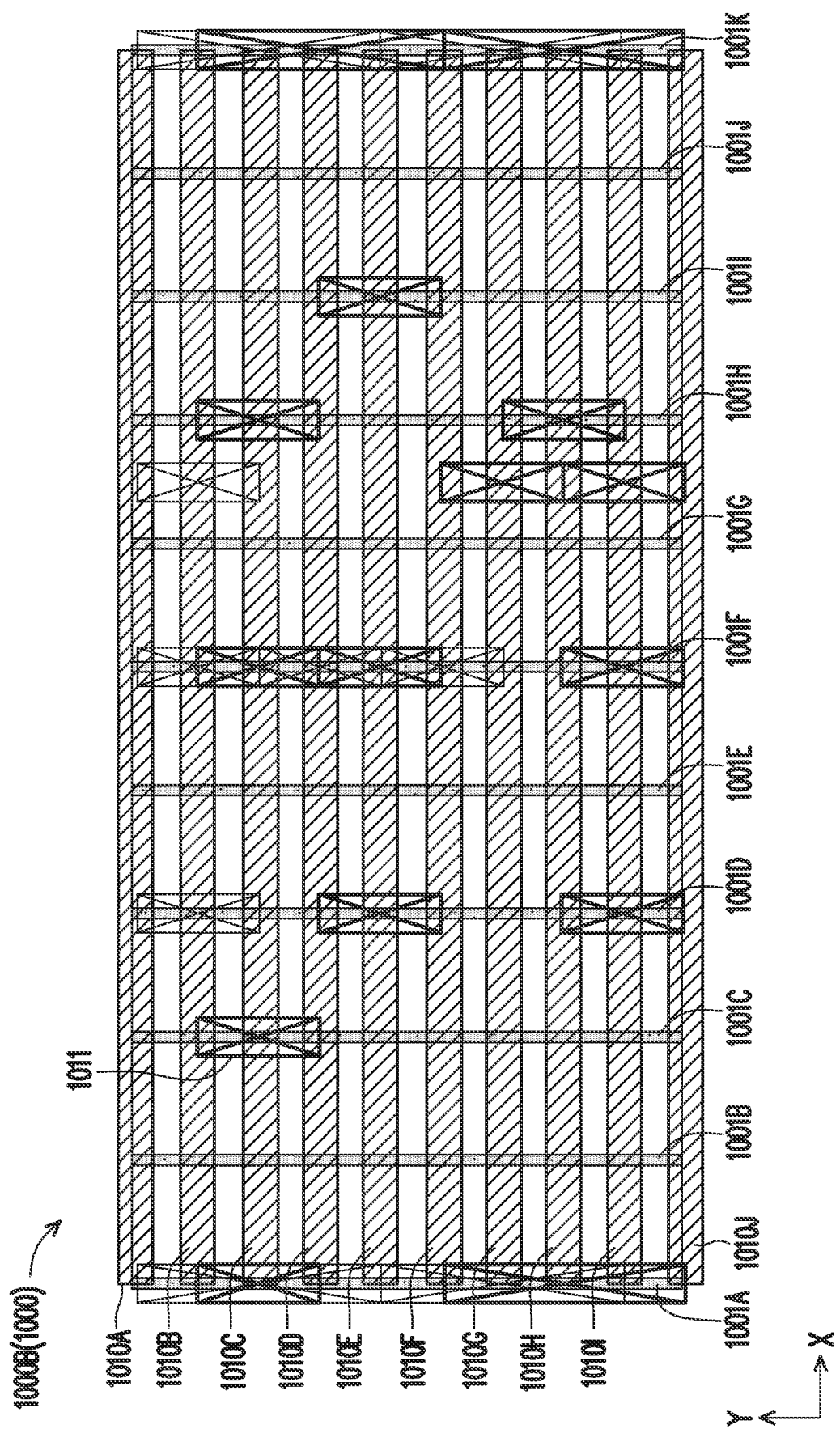

Referring next to FIG. 10B, a second layout level 1000B of the layout design 1000, which includes a number of patterns to form a number of interconnect structures on the front side of the substrate, is shown, in accordance with various embodiments. For purpose of reference, the gate structures 1001A to 1001K (FIG. 10A) are again shown in FIG. 10B.

The second layout level 1000B includes patterns 1010A, 1010B, 1010C, 1010D, 1010E, 1010F, 1010G, 1010H, 1010I, and 1010J. The patterns 1010A to 1010) may each extend along the X axis and be configured to form an interconnect structure in a bottommost metallization layer over the front side of substrate (e.g., an M0 layer). The patterns 1010A through 1010) are herein referred to as "M0 track 1010A," "M0 track 1010B," "M0 track 1010C," "M0 track 1010D," "M0 track 1010E," "M0 track 1010F," "M0 track 1010G," "M0 track 1010H," "M0 track 1010I," and "M0 track 1010J," respectively.

In some embodiments, the M0 track 1010A, disposed along or over a third boundary of the layout design (cell), may be configured to carry a power supply voltage (e.g., VDD), and function as a shielding metal track. The M0 track 1010J, disposed along or over a fourth boundary of the layout design (cell), may be configured to carry a supply voltage (e.g., VSS), and function as a shielding metal track. Such shielding metal tracks may not be connected to any of the active regions, in some embodiments. To connect the transistors as shown in FIG. 9, some of the M0 tracks may be "cut" into a plurality of portions by one or more M0 cut patterns, e.g., 1011.

Figure 10C:
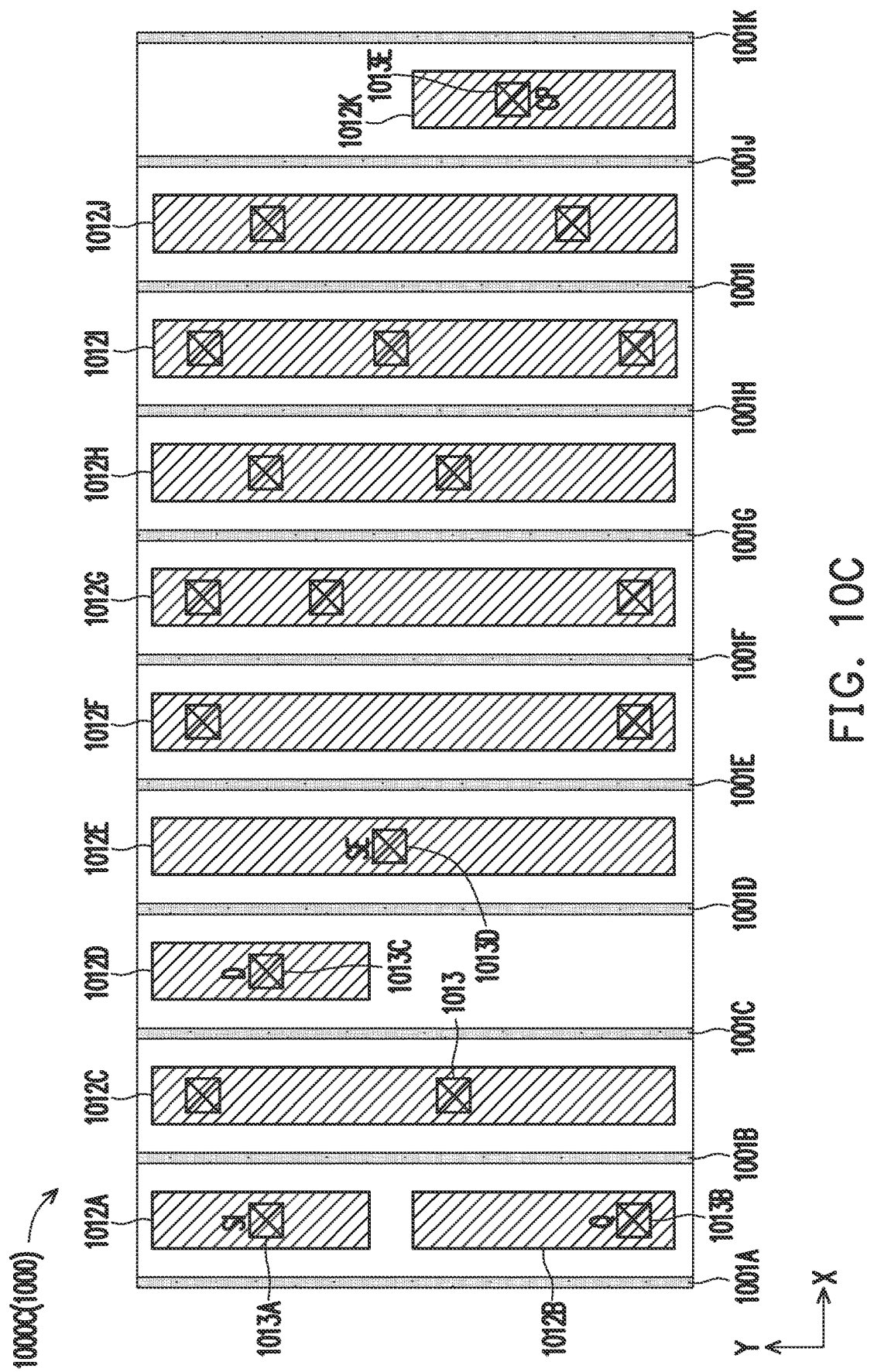

Referring next to FIG. 10C, a third layout level 1000C of the layout design 1000, which includes a number of patterns to form a number of interconnect structures on the front side of the substrate, is shown, in accordance with various embodiments. For purpose of reference, the gate structures 1001A to 1001K (FIG. 10A) are again shown in FIG. 10C.

The third layout level 1000C includes patterns 1012A, 1012B, 1012C, 1012D, 1012E, 1012F, 1012G, 1012H, 1012I, 1012J, and 1012K. The patterns 1012A to 1012K may each extend along the Y axis and be configured be configured to form an interconnect structure at the next upper metallization layer (e.g., an M1 layer). The patterns 1012A through 1012K are herein referred to as "M1 track 1012A," "M1 track 1012B," "M1 track 1012C," "M1 track 1012D," "M1 track 1012E," "M1 track 1012F," "M1 track 1012G," "M1 track 1012H," "M1 track 1012I," "M1 track 1012J," and "M1 track 1012K," respectively.

Each of the M1 tracks 1012A to 1012K may be electrically coupled to at least one M0 track, through a via structure (e.g., V0), to either receive one of the inputs SI, D, SE, and CP (FIG. 9), or provide the output Q (FIG. 9). For example, the M1 track 1012A is electrically coupled to a cut portion of the M0 track 1010C through a via structure 1013A (hereinafter "1013A") to receive the input SI; the M1 track 1012B is electrically coupled to a cut portion of the M0 track 1010I through a via structure 1013B (hereinafter "1013B") to provide the output Q; the M1 track 1012D is electrically coupled to a cut portion of the M0 track 1010C through a via structure 1013C (hereinafter "1013C") to receive the input D; the M1 track 1012E is electrically coupled to a cut portion of the M0 track 1010E through a via structure 1013D (hereinafter "1013D") to receive the input SE; and the M1 track 1012K is electrically coupled to a cut portion of the M0 track 1010H through a via structure 1013E (hereinafter "1013E") to receive the input CP.

Figure 10D:
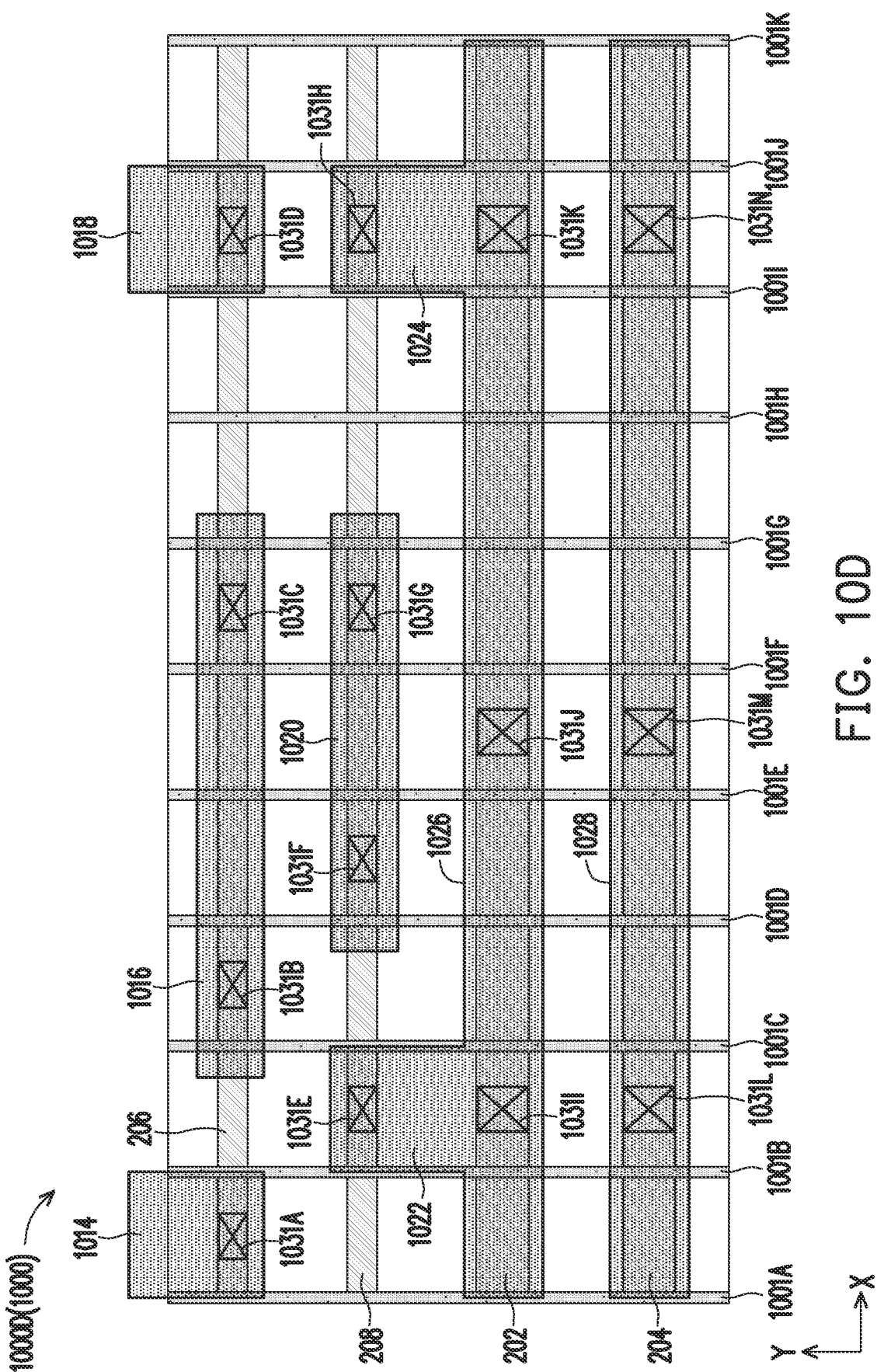

Referring then to FIG. 10D, a fourth layout level 1000D of the layout design 1000, which includes a number of patterns to form a number of interconnect structures on the back side of the substrate, is shown, in accordance with various embodiments. For purpose of reference, the gate structures 1001A to 1001K and the active regions 202 to 208 formed on the front side (FIG. 10A) are again shown in FIG. 10D.

The fourth layout level 1000D includes patterns 1014, 1016, 1018, 1020, 1022, 1024, 1026, and 1028. The patterns 1014, 1018, 1022, and 1024 can be each an example of the interconnect structure pattern 214 or 216; the patterns 1016 and 1020 can be an example of the interconnect structure pattern 218; and the patterns 1026 and 1028 can be each an example a portion of the interconnect structure pattern 210 or 212, shown in FIG. 2. The patterns 1014 to 1028 may each be configured be configured to form an interconnect structure at the bottommost metallization layer over a back side of the substrate (e.g., a BM0 layer). The patterns 1014 through 1028 are herein referred to as "BM0 track 1014," "BM0 track 1016," "BM0 track 1018," "BM0 track 1020," "BM0 track 1022," "BM0 track 1024," "BM0 track 1026," and "BM0 track 1028," respectively. The BM0 tracks 1022 and 1024 may abut the BM0 track 1026, respectively, as shown in FIG. 10D. In some embodiments, the BM0 tracks 1022, 1024, and 1026 can each carry a first power supply voltage (e.g., VSS) and the BM0 tracks 1014, 1018, and 1028 can carry a second power supply voltage (e.g., VDD), while the BM0 tracks 1016 and 1020 may each carry a signal other than any of the power supply voltages. The BM0 tracks 1014, 1018, 1022, 1024, 1026, and 1028 may each be an implementation of the SD power line 214 or 216, and the BM0 tracks 1016 and 1020 (even extending along a single direction) may be an implementation of the MD signal line 218, as discussed with respect to the layout design 200 of FIG. 2.

The BM0 track 1014 can electrically couple to a portion of the active region 206 through a back side via structure, formed by a pattern 1031A (hereinafter "VB 1031A"); the BM0 track 1018 can electrically couple to a portion of the active region 206 through a back side via structure, formed by a pattern 1031D (hereinafter "VB 1031D"); the BM0 track 1022 can electrically couple to a portion of the active region 208 through a back side via structure, formed by a pattern 1031E (hereinafter "VB 1031E"); the BM0 track 1024 can electrically couple to a portion of the active region 208 through a back side via structure, formed by a pattern 1031H (hereinafter "VB 1031H"); the BM0 track 1026 can electrically couple to a number of portions of the active region 202 through a back side via structure formed by a pattern 1031I (hereinafter "VB 1031I"), a back side via structure formed by a pattern 1031J (hereinafter "VB 1031J"), and a back side via structure formed by a pattern 1031K (hereinafter "VB 1031K"), respectively; and the BM0 track 1028 can electrically couple to a number of portions of the active region 204 through a back side via structure formed by a pattern 1031L (hereinafter "VB 1031L"), a back side via structure formed by a pattern 1031M (hereinafter "VB 1031M"), and a back side via structure formed by a pattern 1031N (hereinafter "VB 1031N"), respectively. As such, each of the BM0 tracks 1014, 1018, 1022, 1024, 1026, and 1028 can deliver or otherwise provide either VDD or VSS to the corresponding node, per the design of the circuit.

The BM0 track 1016 can electrically couple a portion of the active region 206 to another portion of the active region 206 through a back side via structure formed by a pattern 1031B (hereinafter "VB 1031B") and a back side via structure formed by a pattern 1031C (hereinafter "VB 1031C"). The BM0 track 1020 can electrically couple a portion of the active region 208 to another portion of the active region 208 through a back side via structure formed by a pattern 1031F (hereinafter "VB 1031F") and a back side via structure formed by a pattern 1031G (hereinafter "VB 1031G"). The BM0 tracks 1016 and 1020 can each couple different portions of an active region so as to couple the corresponding (internal) nodes to each other, per the design of the circuit.

Figure 11:
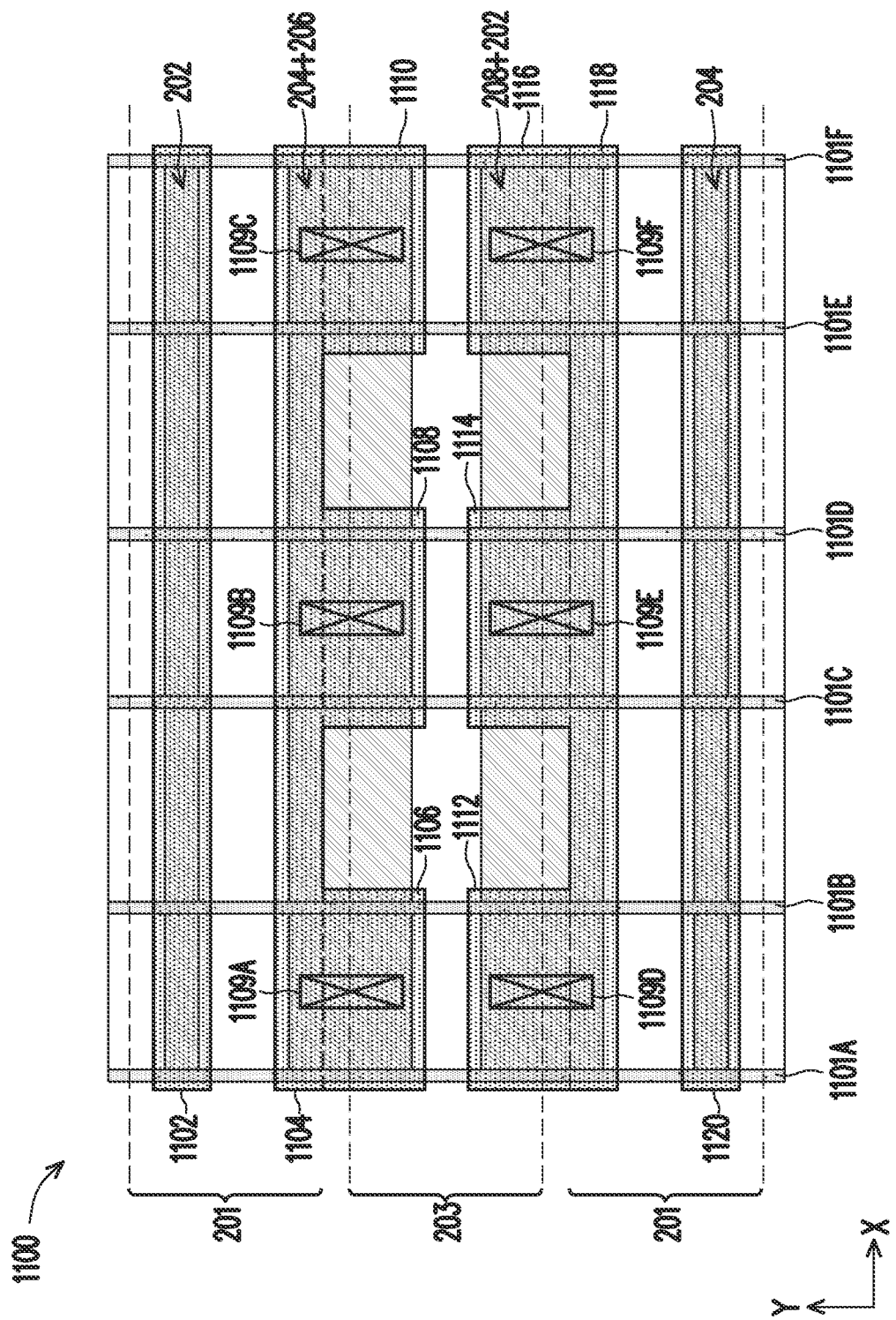
FIG. 11 illustrates a layout level of a cell that corresponds to an example inverter circuit, in accordance with some embodiments.

FIG. 11 illustrates a layout design 1100 of a cell that corresponds to the multi-stage inverter to be placed over one SC row 203 and two TC rows 201, e.g., the cell 250 of FIG. 2. The layout designs 1100 includes a layout level showing patterns to form the back side interconnect structures, while patterns to form active regions and gate structures on the front side are present for reference.

As shown, the active region 204 of one of the TC rows 201 (e.g., the upper TC row 201) and the active region 206 of the SC row 203 merge with each other to form a first wider active region in the layout design 1100. Similarly, the active region 202 of the other one of the TC rows 201 (e.g., the lower TC row 201) and the active region 208 of the SC row 203 merge with each other to form a second wider active region in the layout design 1100. With the active regions 202, 204 merged with 206, 208 merged with 202, and 204, and gate structures 1101A through 1101F present, the layout design (level) 1100 includes patterns 1102, 1104, 1106, 1108, 1110, 1112, 1114, 1116, 1118, and 1120. The patterns 1102 through 1120 may each be configured be configured to form an interconnect structure at the bottommost metallization layer over a back side of the substrate (e.g., a BM0 layer). The patterns 1102, 1104, 1106, 1108, 1110, 1112, 1114, 1116, 1118, and 1120 are herein referred to as "BM0 track 1102," "BM0 track 1104," "BM0 track 1106," "BM0 track 1108," "BM0 track 1110," "BM0 track 1112," "BM0 track 1114," "BM0 track 1116," "BM0 track 1118," and "BM0 track 1120," respectively.

In some embodiments, the BM0 tracks 1102, 1112, 1114, 1116, and 1118 can each carry a first power supply voltage (e.g., VSS), and the BM0 tracks 1104, 1006, 1108, 1110, and 1120 can carry a second power supply voltage (e.g., VDD). In some embodiments, the BM0 tracks 1106, 1108, and 1100 may each abut the M0 track 1104, and the BM0 tracks 1112, 1114, and 1116 may each abut the M0 track 1118, as shown. The BM0 tracks 1102 through 1120 may each be an implementation of the SD power line 210 or 212, as discussed with respect to the layout design 200 of FIG. 2.

The abutted portions of the BM0 tracks, 1104 and 1106, 1104 and 1108, and 1104 and 1110 can electrically couple to respective portions of the merged active region, 204 and 206, through a number of back side via structures that are respectively formed by patterns 1109A (hereinafter "VB 1109A"), 1109B (hereinafter "VB 1109B"), and 1109C (hereinafter "VB 1109C"). The abutted portions of the BM0 tracks, 1118 and 1112, 1118 and 1114, and 1118 and 1116 can electrically couple to respective portions of the merged active region, 208 and 202, through a number of back side via structures that are respectively formed by patterns 1109D (hereinafter "VB 1109D"), 1109E (hereinafter "VB 1109E"), and 1109F (hereinafter "VB 1109F"). As such, each of the BM0 tracks 1102 through 1120 can deliver or otherwise provide either VDD or VSS to the corresponding node, per the design of the circuit.

Figure 12:
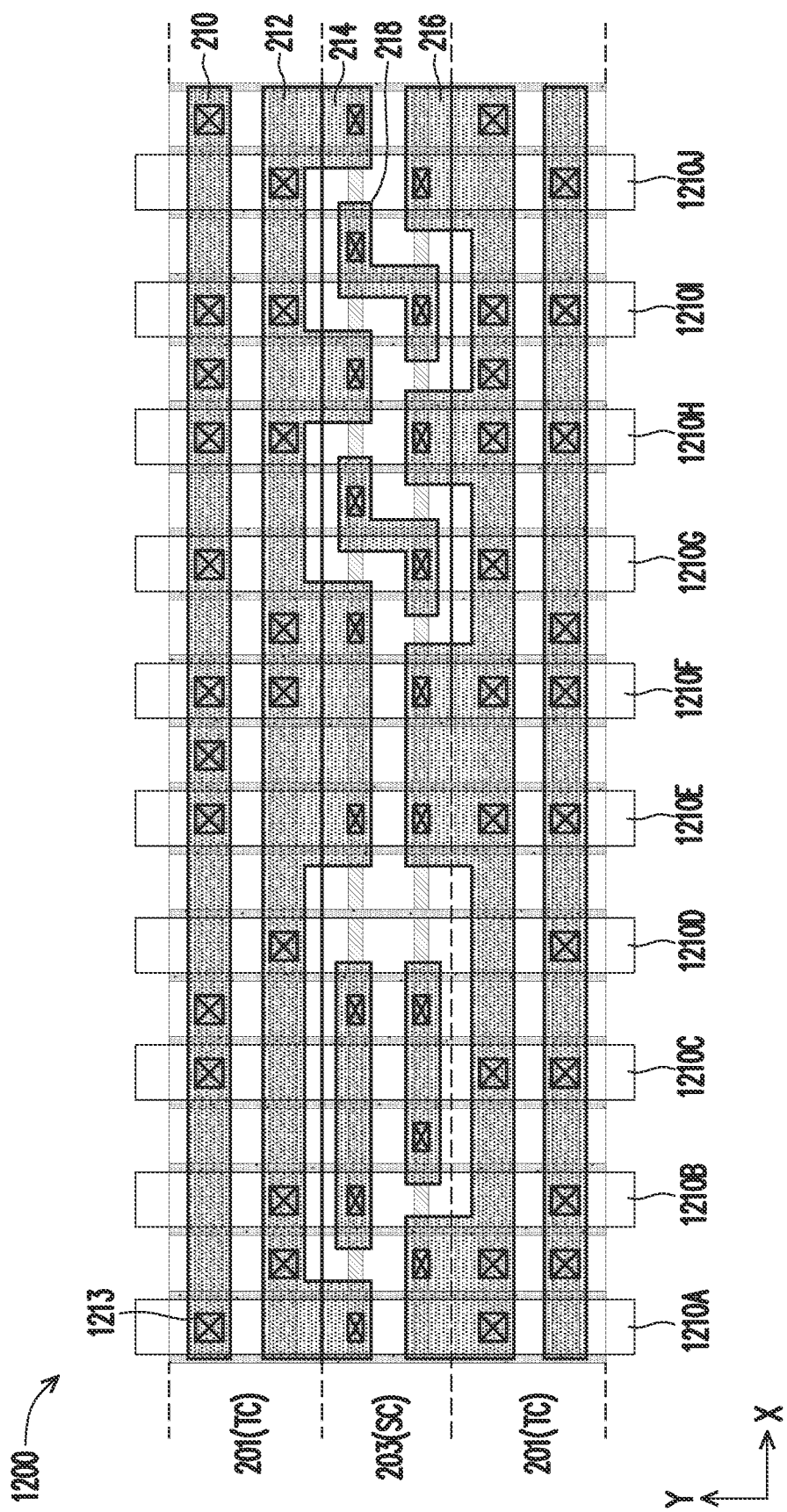
FIG. 12 illustrates a layout design of a semiconductor device that includes multiple back side metallization layers, in accordance with some embodiments.

Although the layout designs, as discussed above, illustrate the bottommost metallization layer (BM0 layer) over the back side of the substrate, it should be understood that each of the layout designs can include any number of metallization layers disposed over the back side of the substrate. FIG. 12 illustrate a layout design 1200 that includes a number of patterns to form back side interconnect structures on top of the BM0 layer. The layout design 1200 can be a portion of the layout design 200 (FIG. 2). For example in FIG. 12, the layout design 1200 includes one SC row 203 sandwiched by two TC rows 201, and a number of BM0 tracks 210 to 218.

Further, the layout design 1200 includes patterns 1210A, 1210B, 1210C, 1210D, 1210E, 1210F, 1210G, 1210H, 1210I, and 1210J. The patterns 1210A through 1210J may each be configured be configured to form an interconnect structure at the next upper metallization layer with respect to the BM0 layer (e.g., a BM1 layer). The patterns 1210A, 1210B, 1210C, 1210D, 1210E, 1210F, 1210G, 1210H, 1210I, and 1210J are herein referred to as "BM1 track 1210A," "BM1 track 1210B," "BM1 track 1210C," "BM1 track 1210D," "BM1 track 1210E," "BM1 track 1210F," "BM1 track 1210G," "BM1 track 1210H," "BM1 track 1210I," and "BM1 track 1210J," respectively. In some embodiments, the BM1 tracks 1210A to 1210J may each extend along a direction (e.g., the Y axis) perpendicular to the extending direction of the BM0 tracks that are configured to carry the power supply voltage, e.g., the BM0 tracks 210 and 212. In some embodiments, the BM1 tracks 1210A, 1210C, 1210E, 1210G, and 1210I can each carry a first power supply voltage (e.g., VDD), and the BM1 tracks 1210B, 1210D, 1210F, 1210H, and 1210J can carry a second power supply voltage (e.g., VSS). Each of the BM1 tracks can electrically couple to one or more of the BM0 tracks through one or more back side via structures (e.g., VB0), formed by patterns 1213 (hereinafter "VB0 1213").

Figure 13:
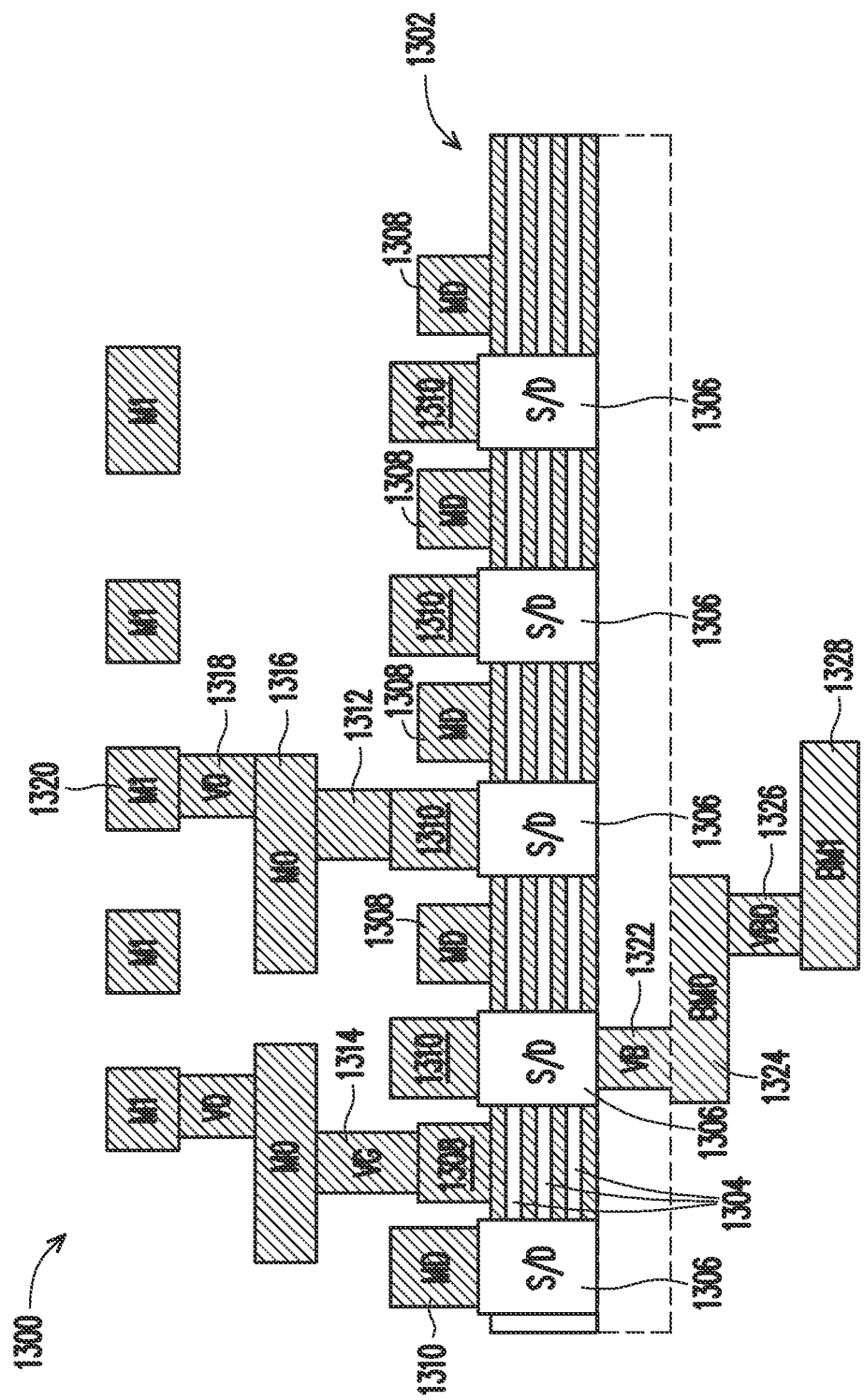
FIG. 13 illustrates a cross-sectional view of a reference semiconductor device, in accordance with some embodiments.

FIG. 13 illustrates a cross-sectional view of a semiconductor device 1300 that includes the above-described features/structures. The cross-sectional view of FIG. 13 is cut along the lengthwise direction of a channel of the semiconductor device 1300, which is implemented as a GAA FET device. FIG. 13 is simplified to illustrate relatively spatial configurations of the above-discussed structures, and thus, it should be understood that one or more features/structures of a completed GAA FET device may not be shown in FIG. 13.

On the front side of a substrate (which is enclosed by a dotted line, as it has been removed when forming the back side interconnect structures), the semiconductor device 1300 includes an active region 1302 having portions being formed as channels 1304 and portions being formed as source/drain structures 1306. The channel 1304 includes one or more nanostructures (e.g., nanosheets, nanowires) vertically spaced apart from each other, in various embodiments. The semiconductor device 1300 includes a number of (e.g., metal) gate structures 1308, each on which wraps around the nanostructures of a corresponding channel 1304. Over the source/drain structure 1306, the semiconductor device 1300 includes a number of MDs 1310, some of which are coupled with VDs 1312 formed thereupon. Over the gate structure 1308, the semiconductor device 1300 includes a number of VGs 1314. The VD 1312 can couple the MD 1310 to a first M0 track 1316. The VG 1314 can couple the gate structure 1308 to a second M0 track 1316. Over the M0 track 1316, the semiconductor device 1300 includes a number of VOs 1318 to couple the M0 tracks 1316 to a number of M1 tracks 1320. On the back side of the substrate, the semiconductor device 1300 includes a number of VBs 1322 that can each couple the source/drain structure 1306 to a BM0 track 1324. Further, over the BM0 track 1324, the semiconductor device 1300 includes a number of VB0s 1326 that can each couple the BM0 track 1324 to a BM1 track 1328.

Figure 14:
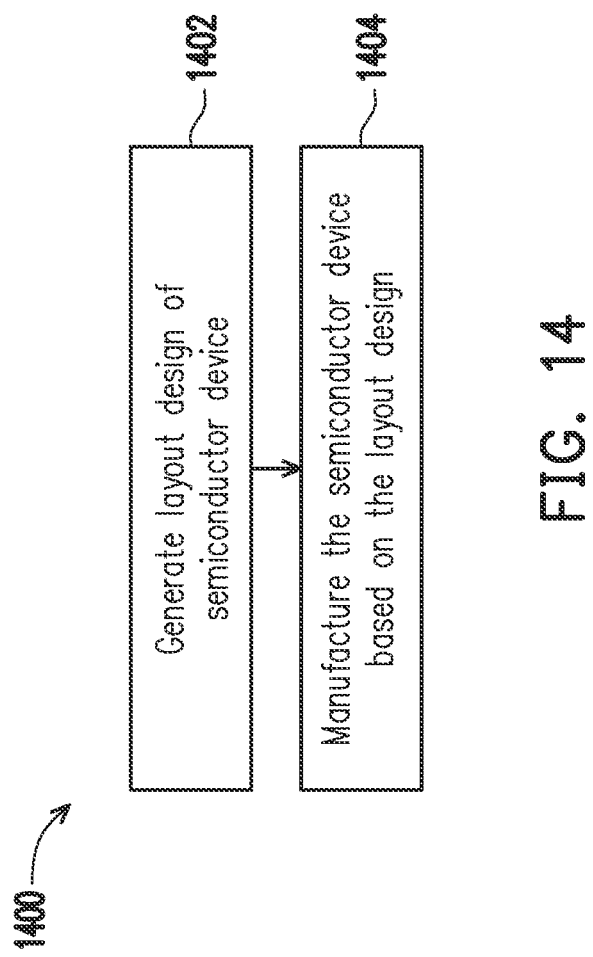
FIG. 14 illustrates a flowchart of a method of manufacturing a semiconductor device, in accordance with some embodiments.

FIG. 14 is a flowchart of a method 1400 of forming or manufacturing a semiconductor device, in accordance with some embodiments. It is understood that additional operations may be performed before, during, and/or after the method 1400 depicted in FIG. 14. In some embodiments, the method 1400 is usable to form a semiconductor device, according to various layout designs as disclosed herein.

In operation 1410 of the method 1400, a layout design of a semiconductor device (e.g., the layout design 200 of FIG. 2) is generated. The operation 1410 is performed by a processing device (e.g., processor 1502 of FIG. 15) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In operation 1420 of the method 1400, a semiconductor device is manufactured based on the layout design. In some embodiments, the operation 1420 of the method 1400 includes manufacturing at least one mask based on the layout design, and manufacturing the a semiconductor device based on the at least one mask. A number of example manufacturing operations of the operation 1420 will be discussed with respect to the method 1700 of FIG. 17 below.

Figure 15:
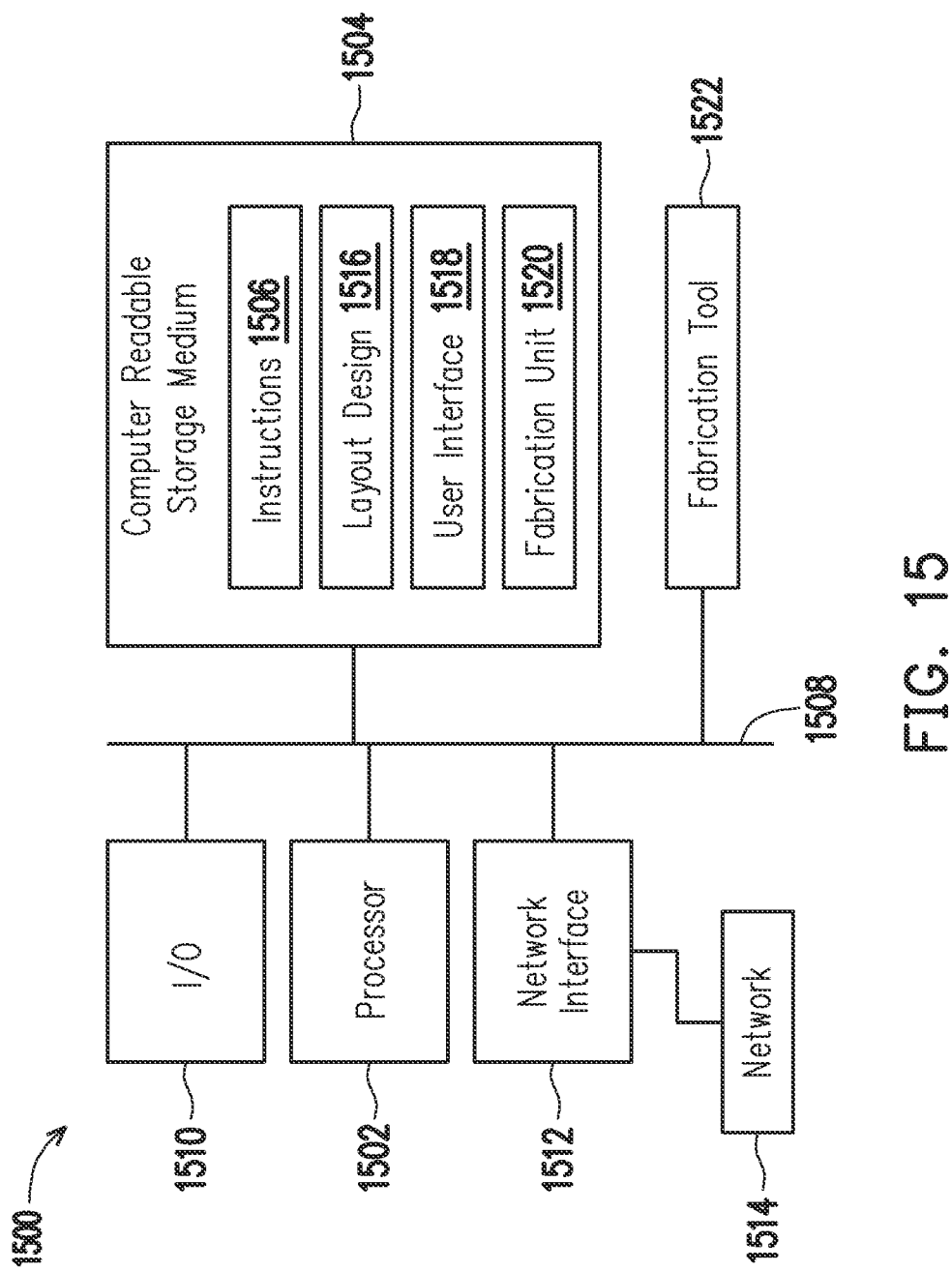
FIG. 15 illustrates a block diagram of a system of generating an IC layout design, in accordance with some embodiments.

FIG. 15 is a schematic view of a system 1500 for designing and manufacturing an IC layout design, in accordance with some embodiments. The system 1500 generates or places one or more IC layout designs, as described herein. In some embodiments, the system 1500 manufactures one or more semiconductor devices based on the one or more IC layout designs, as described herein. The system 1500 includes a hardware processor 1502 and a non-transitory, computer readable storage medium 1504 encoded with, e.g., storing, the computer program code 1506, e.g., a set of executable instructions. The computer readable storage medium 1504 is configured for interfacing with manufacturing machines for producing the semiconductor device. The processor 1502 is electrically coupled to the computer readable storage medium 1504 by a bus 1508. The processor 1502 is also electrically coupled to an I/O interface 1510 by the bus 1508. A network interface 1512 is also electrically connected to the processor 1502 by the bus 1508. Network interface 1512 is connected to a network 1514, so that the processor 1502 and the computer readable storage medium 1504 are capable of connecting to external elements via network 1514. The processor 1502 is configured to execute the computer program code 1506 encoded in the computer readable storage medium 1504 in order to cause the system 1500 to be usable for performing a portion or all of the operations as described in method 1400.

In some embodiments, the processor 1502 is a central processing unit (CPU), a multi-processor, a distributed processing system, an application specific integrated circuit (ASIC), and/or a suitable processing unit.

INN In some embodiments, the computer readable storage medium 1504 is an electronic, magnetic, optical, electromagnetic, infrared, and/or a semiconductor system (or apparatus or device). For example, the computer readable storage medium 1504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1504 includes a compact disk-read only memory (CD-ROM), a compact disk-read/write (CD-R/W), and/or a digital video disc (DVD).

In some embodiments, the storage medium 1504 stores the computer program code 1506 configured to cause the system 1500 to perform the method 1400. In some embodiments, the storage medium 1504 also stores information needed for performing method 1400 as well as information generated during performance of method 1400, such as layout design 1516, user interface 1518, fabrication unit 1520, and/or a set of executable instructions to perform the operation of method 1400.

In some embodiments, the storage medium 1504 stores instructions (e.g., the computer program code 1506) for interfacing with manufacturing machines. The instructions (e.g., the computer program code 1506) enable the processor 1502 to generate manufacturing instructions readable by the manufacturing machines to effectively implement the method 1400 during a manufacturing process.

The system 1500 includes the I/O interface 1510. The I/O interface 1510 is coupled to external circuitry. In some embodiments, the I/O interface 1510 includes a keyboard, keypad, mouse, trackball, trackpad, and/or cursor direction keys for communicating information and commands to the processor 1502.

The system 1500 also includes the network interface 1512 coupled to the processor 1502. The network interface 1512 allows the system 1500 to communicate with the network 1514, to which one or more other computer systems are connected. The network interface 1512 includes wireless network interfaces such as BLUETOOTH, WIFI, WIMAX, GPRS, or WCDMA; or wired network interface such as ETHERNET, USB, or IEEE-13154. In some embodiments, the method 1400 is implemented in two or more systems 1500, and information such as layout design, user interface and fabrication unit are exchanged between different systems 1500 by the network 1514.

The system 1500 is configured to receive information related to a layout design through the I/O interface 1510 or network interface 1512. The information is transferred to the processor 1502 by the bus 1508 to determine a layout design for producing an IC. The layout design is then stored in the computer readable medium 1504 as the layout design 1516. The system 1500 is configured to receive information related to a user interface through the I/O interface 1510 or network interface 1512. The information is stored in the computer readable medium 1504 as the user interface 1518. The system 1500 is configured to receive information related to a fabrication unit through the I/O interface 1510 or network interface 1512. The information is stored in the computer readable medium 1504 as the fabrication unit 1520. In some embodiments, the fabrication unit 1520 includes fabrication information utilized by the system 1500.

In some embodiments, the method 1400 is implemented as a standalone software application for execution by a processor. In some embodiments, the method 1400 is implemented as a software application that is a part of an additional software application. In some embodiments, the method 1400 is implemented as a plug-in to a software application. In some embodiments, the method 1400 is implemented as a software application that is a portion of an EDA tool. In some embodiments, the method 1400 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, the method 1400 is implemented by a manufacturing device to manufacture an integrated circuit using a set of masks manufactured based on one or more layout designs generated by the system 1500. In some embodiments, the system 1500 includes a manufacturing device (e.g., fabrication tool 1522) to manufacture an integrated circuit using a set of masks manufactured based on one or more layout designs of the present disclosure. In some embodiments, the system 1500 of FIG. 15 generates layout designs of an IC that are smaller than other approaches. In some embodiments, the system 1500 of FIG.

15 generates layout designs of a semiconductor device that occupy less area than other approaches.

Figure 16:
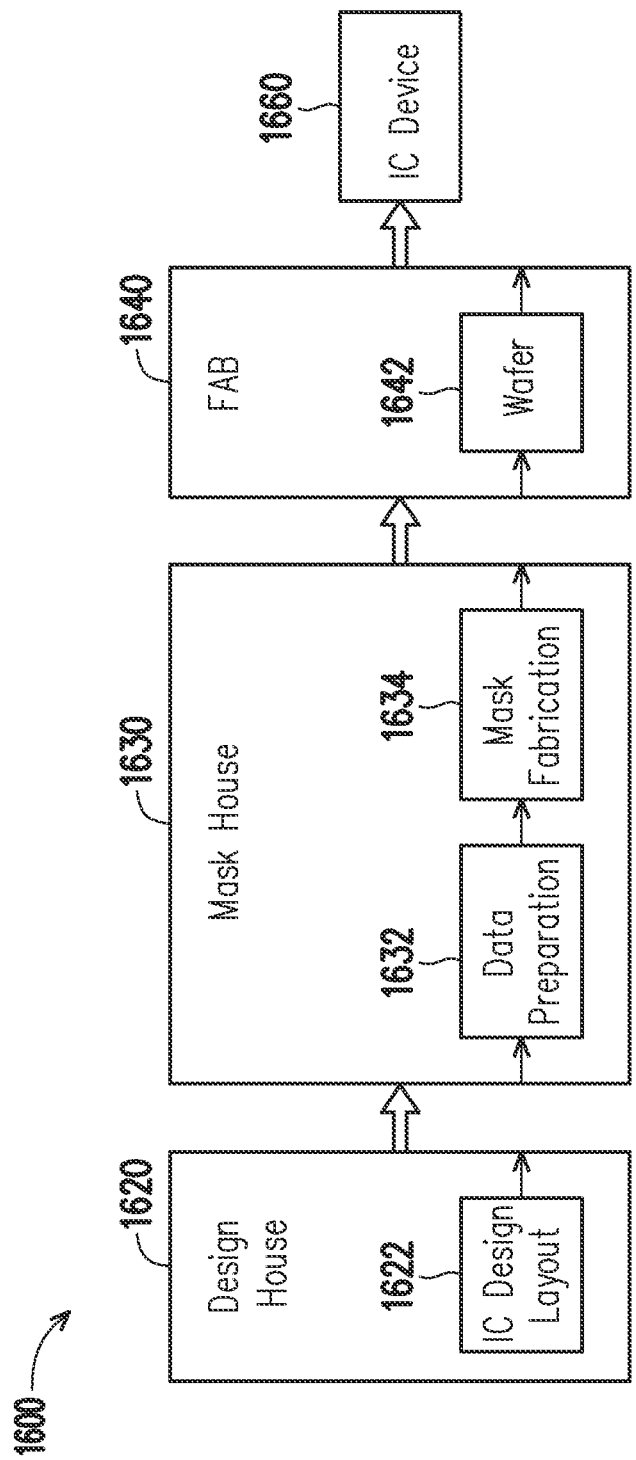
FIG. 16 illustrates a block diagram of an IC manufacturing system, and an IC manufacturing flow associated therewith, in accordance with some embodiments.

FIG. 16 is a block diagram of an integrated circuit (IC)/semiconductor device manufacturing system 1600, and an IC manufacturing flow associated therewith, in accordance with at least one embodiment of the present disclosure.

In FIG. 16, the IC manufacturing system 1600 includes entities, such as a design house 1620, a mask house 1630, and an IC manufacturer/fabricator ("fab") 1640, that interact with one another in the design, development, and manufacturing cycles and/or services related to manufacturing an IC device (semiconductor device) 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1640 is owned by a single company. In some embodiments, two or more of design house 1620, mask house 1630, and IC fab 1640 coexist in a common facility and use common resources.

The design house (or design team) 1620 generates an IC design layout 1622. The IC design layout 1622 includes various geometrical patterns designed for the IC device 1660. The geometrical patterns correspond to patterns of metal, oxide, or semiconductor layers that make up the various components of the IC device 1660 to be fabricated. The various layers combine to form various IC features. For example, a portion of the IC design layout 1622 includes various IC features, such as an active region, gate structures, source/drain structures, interconnect structures, and openings for bonding pads, to be formed in a semiconductor substrate (such as a silicon wafer) and various material layers disposed on the semiconductor substrate. The design house 1620 implements a proper design procedure to form the IC design layout 1622. The design procedure includes one or more of logic design, physical design or place and route. The IC design layout 1622 is presented in one or more data files having information of the geometrical patterns. For example, the IC design layout 1622 can be expressed in a GDSII file format or DFII file format.

The mask house 1630 includes mask data preparation 532 and mask fabrication 534. The mask house 1630 uses the IC design layout 1622 to manufacture one or more masks to be used for fabricating the various layers of the IC device 1660 according to the IC design layout 1622. The mask house 1630 performs the mask data preparation 1632, where the IC design layout 1622 is translated into a representative data file ("RDF"). The mask data preparation 1632 provides the RDF to the mask fabrication 1634. The mask fabrication 1634 includes a mask writer. A mask writer converts the RDF to an image on a substrate, such as a mask (reticle) or a semiconductor wafer. The design layout is manipulated by the mask data preparation 1632 to comply with particular characteristics of the mask writer and/or requirements of the IC fab 1640. In FIG. 16, the mask data preparation 1632 and mask fabrication 1634 are illustrated as separate elements. In some embodiments, the mask data preparation 1632 and mask fabrication 1634 can be collectively referred to as mask data preparation.

In some embodiments, the mask data preparation 1632 includes optical proximity correction (OPC) which uses lithography enhancement techniques to compensate for image errors, such as those that can arise from diffraction, interference, other process effects and the like. OPC adjusts the IC design layout 1622. In some embodiments, the mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 534, which may undo part of the modifications performed by OPC in order to meet mask creation rules.

In some embodiments, the mask data preparation 1632 includes lithography process checking (LPC) that simulates processing that will be implemented by the IC fab 1640 to fabricate the IC device 1660. LPC simulates this processing based on the IC design layout 1622 to create a simulated manufactured device, such as the IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 1622.

It should be understood that the above description of the mask data preparation 1632 has been simplified for the purposes of clarity. In some embodiments, the mask data preparation 1632 includes additional features such as a logic operation (LOP) to modify the IC design layout according to manufacturing rules. Additionally, the processes applied to the IC design layout 1622 during the mask data preparation 1632 may be executed in a variety of different orders.

After the mask data preparation 1632 and during mask fabrication 1634, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 534 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 1640 is an IC fabrication entity that includes one or more manufacturing facilities for the fabrication of a variety of different IC products. In some embodiments, the IC fab 1640 is a semiconductor foundry. For example, there may be a first manufacturing facility for the front end fabrication of a plurality of IC products (e.g., source/drain structures, gate structures), while a second manufacturing facility may provide the middle end fabrication for the interconnection of the IC products (e.g., MDs, VDs, VGs) and a third manufacturing facility may provide the back end fabrication for the interconnection and packaging of the IC products (e.g., M0 tracks, M1 tracks, BM0 tracks, BM1 tracks), and a fourth manufacturing facility may provide other services for the foundry entity.

The IC fab 1640 uses the mask (or masks) fabricated by the mask house 1630 to fabricate the IC device 1660. Thus, the IC fab 1640 at least indirectly uses the IC design layout 1622 to fabricate the IC device 1660. In some embodiments, a semiconductor wafer 1642 is fabricated by the IC fab 1640 using the mask (or masks) to form the IC device 1660. The semiconductor wafer 1642 includes a silicon substrate or other proper substrate having material layers formed thereon. Semiconductor wafer further includes one or more of various doped regions, dielectric features, multilevel interconnects, and the like (formed at subsequent manufacturing steps).

The system 1600 is shown as having the design house 1620, mask house 1630, and IC fab 1640 as separate components or entities. However, it should be understood that one or more of the design house 1620, mask house 1630 or IC fab 1640 are part of the same component or entity.

Figure 17:
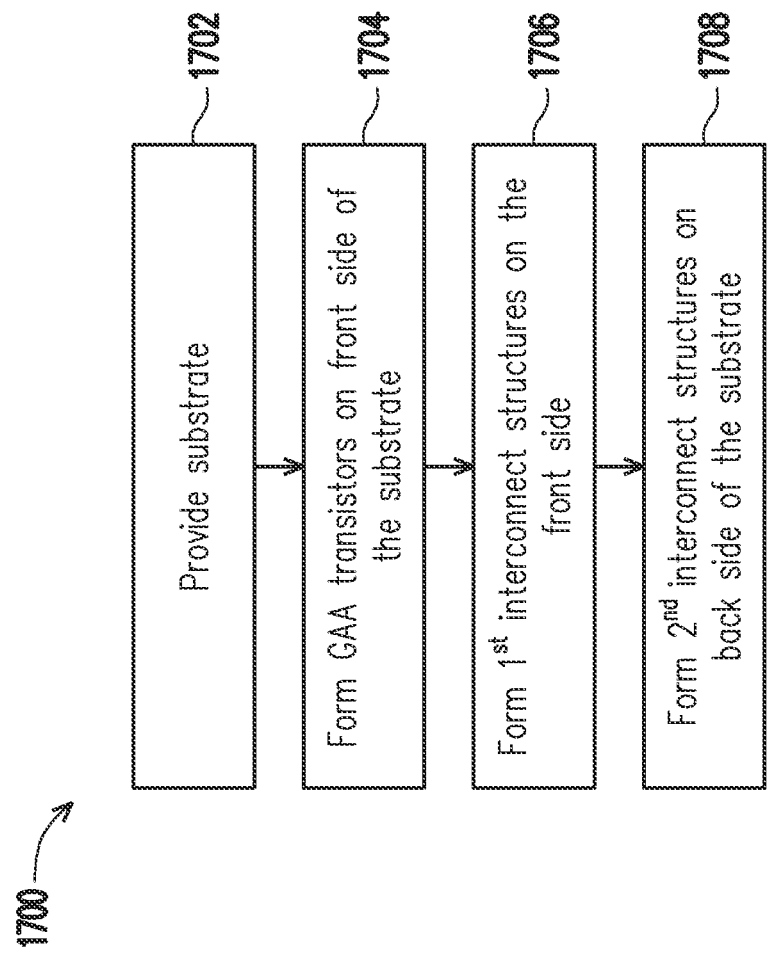
FIG. 17 illustrates a flow chart of an example method for making a non-planar transistor device, in accordance with some embodiments.

FIG. 17 is a flowchart illustrating an example method 1700 for fabricating a semiconductor device that includes the disclosed backside SD power lines and/or backside MD signal lines, according to various aspects of the present disclosure. The method 1700 may be part of the operation 1420 of the method 1400 (FIG. 14). As such, the semiconductor device may be made based on at least a portion of the layout design disclosed herein.

At least some operations of the method 1700 can be used to form a semiconductor device in a non-planar transistor configuration. For example, the semiconductor device may include one or more gate-all-around (GAA) transistors. However, it should be understood that the transistors of the semiconductor device may be each configured in any of various other types of transistors such as, for example, a CFET, while remaining within the scope of the present disclosure. It should be noted that the method 1700 is merely an example, and is not intended to limit the present disclosure. Accordingly, it should be understood that additional operations may be provided before, during, and/or after the method 1700, and that some other operations may only be briefly described herein. The following discussions of the method 1700 may refer to one or more components of FIGS. 1-16.

In brief overview, the method 1700 starts with operation 1702 of providing a semiconductor substrate. The method 1700 proceeds to operation 1704 of forming a number of GAA transistors on a front side of the semiconductor substrate. The method 1700 proceeds to operation 1706 of forming a number of first interconnect structure on the front side. The method 1700 proceeds to operation 1708 of forming a number of second interconnect structures on a back side of the semiconductor substrate. The second interconnect structures may include the disclosed SD power lines and MID signal lines.

Corresponding to operation 1702, the semiconductor substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Corresponding to operation 1704, on the front side of the semiconductor substrate, a number of GAA transistors are formed. The GAA transistors may each be formed by at least some of the following process steps: forming a fin structure protruding from the substrate, wherein the fin structure includes a number of first semiconductor nanostructures and a number of second semiconductor nanostructures alternately stacked on top of one another; forming a dummy gate structure straddling the fin structure; forming gate spacers disposed along opposite sidewalls of the dummy gate structure; recessing portions of the fin structure that are not overlaid by the dummy gate structure (and the gate spacer); replacing respective end portions of each second semiconductor nanostructures with a dielectric material to form a number of inner spacers; forming source/drain structures in the fin structure that are disposed on opposite sides of the dummy gate structure; removing the dummy gate structure; removing the remaining second semiconductor nanostructures; and forming an active (e.g., metal) gate structure to wrap around each of the first semiconductor nanostructures. In some embodiments, the first semiconductor nanostructures may be collectively referred to as a channel of the GAA transistor, and the second semiconductor nanostructures being replaced with the active gate structure may be referred to as sacrificial nano structures.

Corresponding to operation 1706, on the front side of the semiconductor substrate, the first interconnect structures are formed. The first interconnect structures can include a number of middle-end-of-line (MEOL) interconnect structures (e.g., MDs, VDs, VGs), and a number of back-end-of-line (BEOL) interconnect structures (e.g., M0 tracks, VOs, M1 tracks, etc.), as described above. In some embodiments, the MEOL and BEOL interconnect structures can each extend along in a single direction. For example, the MDs may all extend along a first lateral direction in parallel with the gate structures; the M0 tracks may all extend along a second lateral direction perpendicular to the first lateral direction (in parallel with a lengthwise direction of the channel); and the M1 tracks may all extend along the first lateral direction. Each of the first interconnect structures disposed on the front side can include one or more metal materials such as, for example, tungsten (W), copper (Cu), gold (Au), cobalt (Co), Ruthenium (Ru), or combinations thereof.

Corresponding to operation 1708, on the back side of the substrate, the second interconnect structures are formed. In some embodiments, the second interconnect structure may function as a power line (carrying a power signal) or a signal line (carrying a non-power signal), in which the power line may extend along one of the first or second direction while the signal line can be allowed to extend in more than one direction. The second interconnect structures may be formed by at least some of the following process steps: flipping the semiconductor substrate; thinning down the semiconductor substrate from the back side until bottom surfaces of the source/drain structures (or bottom surfaces of dielectric layers underlying the source/drain structures, which are formed prior to epitaxially growing the source/drain structures) are exposed; forming a number of via structures (e.g., VBs) coupled to each of the source/drain structures; and forming the second interconnect structures (e.g., various BM0 tracks discussed above). Each of the second interconnect structures disposed on the back side can include one or more metal materials such as, for example, tungsten (W), copper (Cu), gold (Au), cobalt (Co), Ruthenium (Ru), or combinations thereof.

In one aspect of the present disclosure, a semiconductor device is disclosed. The semiconductor device includes a first active region, disposed on a first side of a substrate, that extends along a first lateral direction. The semiconductor device includes a second active region, disposed on the first side, that extends along the first lateral direction. The first active region has a first conduction type and the second active region has a second conduction type opposite to the first conduction type. The semiconductor device includes a first interconnect structure, formed on a second side of the substrate opposite to the first side, that includes: a first portion extending along the first lateral direction and vertically disposed below the first active region; and a second portion extending along a second lateral direction. The second lateral direction is perpendicular to the first lateral direction.

In another aspect of the present disclosure, an integrated circuit is disclosed. The integrated circuit includes a first row extending along a first direction and having a first height along a second direction perpendicular to the first direction. The first row includes a first active region formed on a first side of a substrate. The integrated circuit includes a second row extending along the first direction and having a second height along the second direction. The second height is greater than the first height, and the second row includes a second active region formed on the first side of the substrate. The integrated circuit includes a signal line structure formed on a second side of the substrate opposite to the first side. The signal line structure is disposed within the first row. The integrated circuit includes a first power line structure formed on the second side of the substrate. The first power line structure is disposed within the second row.

In yet another aspect of the present disclosure, a method for fabricating a semiconductor device is disclosed. The method includes forming a plurality of transistors on a first side of a substrate. The method includes coupling the plurality of transistors by forming, on the first side, a plurality of first interconnect structures extending along either a first lateral direction or a second lateral direction, the first and second lateral directions being perpendicular to each other. The method includes forming, on a second side of the substrate opposite to the first side, a plurality of third interconnect structures. At least one of the third interconnect structures comprises a first portion and a second portion that extend along the first and second lateral directions, respectively. The method includes forming, on the second side, a plurality of power rail structures extending along the first lateral direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first active region, disposed on a front side of a substrate, that extends along a first lateral direction;
   a second active region, disposed on the front side, that extends along the first lateral direction, wherein the first active region has a first conduction type and the second active region has a second conduction type opposite to the first conduction type; and
   a first interconnect structure, formed on a back side of the substrate opposite to the front side, that includes: a first portion extending along the first lateral direction and vertically disposed below the first active region; and a second portion extending along a second lateral direction, wherein the second lateral direction is perpendicular to the first lateral direction, wherein the first interconnect structure is configured to carry a non-power signal, and wherein the first portion and the second portion form a multi-dimensional signal line on the back side of the substrate.

2. The semiconductor device of claim 1, wherein a first end of the second portion of the first interconnect structure is connected to the first portion of the first interconnect structure.

3. The semiconductor device of claim 2, wherein the first interconnect structure includes a third portion extending along the first lateral direction and vertically disposed below the second active region.

4. The semiconductor device of claim 3, wherein a second end of the second portion of the first interconnect structure is connected to the third portion of the first interconnect structure.

5. The semiconductor device of claim 1, further comprising:
   a third active region, disposed on the first side, that extends along the first lateral direction, wherein the third active region has the first conduction type;
   a fourth active region, disposed on the first side, that extends along the first lateral direction, wherein the fourth active region has the second conduction type;
   a plurality of second interconnect structures, formed on the first side above the first to fourth active regions, that extend along the first lateral direction;
   a third interconnect structure, formed on the second side, that extends along the first lateral direction and is vertically below the third active region; and a fourth interconnect structure, formed on the second side, that extends along the first lateral direction and is vertically below the fourth active region.

6. The semiconductor device of claim 5, wherein a number of a first subset of the third interconnect structures electrically coupled to the first and second active regions is less than a number of a second subset of the third interconnect structures electrically coupled to the third and fourth active regions.

7. The semiconductor device of claim 6, wherein each of the third and fourth interconnect structures is configured to carry a power signal.

8. The semiconductor device of claim 1, further comprising a plurality of fourth interconnect structures, formed on the back side, that are each vertically disposed between either the first or second active region and a second interconnect structure formed on the back side.

9. The semiconductor device of claim 1, wherein each of the first and second active regions comprises a plurality of nanostructures vertically separated from each other.

10. An integrated circuit, comprising:
a first row extending along a first direction and having a first height along a second direction perpendicular to the first direction and parallel with a substrate, wherein the first row includes a first active region formed on a front side of the substrate;
a second row extending along the first direction and having a second height along the second direction, wherein the second height is greater than the first height, and wherein the second row includes a second active region formed on the front side of the substrate;
a signal line structure formed on a back side of the substrate opposite to the front side, wherein the signal line structure is disposed within the first row, wherein the signal line structure is configured to carry a non-power signal, and wherein the signal line structure is a multi-dimensional signal line on the back side of the substrate; and
a first power line structure formed on the back side of the substrate, wherein the first power line structure is disposed within the second row.

11. The integrated circuit of claim 10, wherein the signal line structure partially overlaps with the first active region, and the first power line structure completely overlaps with the second active region.

12. The integrated circuit of claim 10, wherein the signal line structure includes a first portion extending along the first direction, and a second portion extending along the second direction.

13. The integrated circuit of claim 12, wherein the first portion overlaps with the first active region, and the second portion does not overlap with the first active region.

14. The integrated circuit of claim 12, wherein respective ends of the first and second portions are connected to each other to form an L-shaped profile.

15. The integrated circuit of claim 10, further comprising a second power line structure on the back side of the substrate, wherein the second power line structure abuts the first power line structure.

16. The integrated circuit of claim 10, wherein each of the first and second active regions comprises a plurality of nanostructures vertically separated from each other.

* * * * *